(12) United States Patent
Shibayama et al.

(10) Patent No.: US 11,022,884 B2
(45) Date of Patent: Jun. 1, 2021

(54) SILICON-CONTAINING RESIST UNDERLAYER FILM-FORMING COMPOSITION HAVING HALOGENATED SULFONYLALKYL GROUP

(71) Applicant: NISSAN CHEMICAL INDUSTRIES, LTD., Tokyo (JP)

(72) Inventors: Wataru Shibayama, Toyama (JP); Kenji Takase, Funabashi (JP); Makoto Nakajima, Toyama (JP); Satoshi Takeda, Toyama (JP); Hiroyuki Wakayama, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/325,769

(22) PCT Filed: Jul. 9, 2015

(86) PCT No.: PCT/JP2015/069761
§ 371 (c)(1),
(2) Date: Jan. 12, 2017

(87) PCT Pub. No.: WO2016/009939
PCT Pub. Date: Jan. 21, 2016

(65) Prior Publication Data
US 2017/0168397 A1    Jun. 15, 2017

(30) Foreign Application Priority Data
Jul. 15, 2014   (JP) .............................. JP2014-145213

(51) Int. Cl.
| | | |
|---|---|---|
| G03F 7/11 | (2006.01) |
| C08G 77/24 | (2006.01) |
| G03F 7/075 | (2006.01) |
| G03F 7/09 | (2006.01) |
| C08G 77/28 | (2006.01) |
| C09D 183/08 | (2006.01) |
| G03F 7/16 | (2006.01) |
| G03F 7/20 | (2006.01) |
| G03F 7/32 | (2006.01) |
| G03F 7/38 | (2006.01) |
| H01L 21/306 | (2006.01) |
| H01L 21/308 | (2006.01) |

(52) U.S. Cl.
CPC .............. *G03F 7/11* (2013.01); *C08G 77/24* (2013.01); *C08G 77/28* (2013.01); *C09D 183/08* (2013.01); *G03F 7/0752* (2013.01); *G03F 7/091* (2013.01); *G03F 7/162* (2013.01); *G03F 7/168* (2013.01); *G03F 7/2004* (2013.01); *G03F 7/327* (2013.01); *G03F 7/38* (2013.01); *H01L 21/3081* (2013.01); *H01L 21/3086* (2013.01); *H01L 21/30604* (2013.01)

(58) Field of Classification Search
CPC ..................................................... G03F 7/0752
See application file for complete search history.

(56) References Cited

U.S. PATENT DOCUMENTS

| | | | | |
|---|---|---|---|---|
| 6,399,271 B1 * | 6/2002 | Ray ....................... B41C 1/1008 | | |
| | | | | 101/456 |
| 2004/0161698 A1 * | 8/2004 | Kanagasabapathy ........................ | | |
| | | | | G03F 7/0382 |
| | | | | 430/270.1 |
| 2012/0178261 A1 | 7/2012 | Kanno et al. | | |
| 2014/0170855 A1 * | 6/2014 | Nakajima .............. G03F 7/0752 | | |
| | | | | 438/703 |
| 2015/0004791 A1 * | 1/2015 | Ogihara .................... G03F 7/11 | | |
| | | | | 438/703 |
| 2015/0322212 A1 * | 11/2015 | Kanno .................. C07F 7/1836 | | |
| | | | | 438/703 |

FOREIGN PATENT DOCUMENTS

| | | |
|---|---|---|
| JP | 2012-533675 A | 12/2012 |
| TW | 201127880 A | 8/2011 |

(Continued)

OTHER PUBLICATIONS

Sep. 8, 2015 Written Opinion of the International Searching Authority issued in International Patent Application No. PCT/JP2015/069761.

(Continued)

*Primary Examiner* — Cynthia Hamilton
(74) *Attorney, Agent, or Firm* — Oliff PLC

(57) ABSTRACT

A resist underlayer film allows an excellent resist pattern shape to be formed when an upper resist layer is exposed to light and developed using an alkaline developing solution or organic solvent; and composition for forming the resist underlayer film. A resist underlayer film-forming composition for lithography, the composition including, as a silane, hydrolyzable silane, hydrolysis product thereof, hydrolysis-condensation product thereof, or combination, wherein the hydrolyzable silane includes hydrolyzable silane of Formula (1):

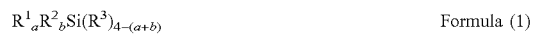

Formula (1)

[where $R^1$ is an organic group of Formula (2):

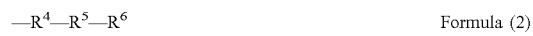

Formula (2)

(where R4 is optionally substituted C1-10 alkylene group; R5 is a sulfonyl group or sulfonamide group; and R6 is a halogen-containing organic group)]. In Formula (2), R6 may be a fluorine-containing organic group like trifluoromethyl group. A resist underlayer film obtained by applying the resist underlayer film-forming composition onto a semiconductor substrate, followed by baking. The underlayer film-forming composition may include acid as a hydrolysis catalyst, or water.

18 Claims, No Drawings

(56) References Cited

FOREIGN PATENT DOCUMENTS

| WO | 2011033965 A1 | 3/2011 |
|---|---|---|
| WO | 2013022099 A1 | 2/2013 |
| WO | 2013191203 A1 | 12/2013 |
| WO | WO 2014/098076 A1 * | 6/2014 |

OTHER PUBLICATIONS

Sep. 8, 2015 Search Report issued in International Application No. PCT/JP2015/069761.

* cited by examiner

SILICON-CONTAINING RESIST UNDERLAYER FILM-FORMING COMPOSITION HAVING HALOGENATED SULFONYLALKYL GROUP

TECHNICAL FIELD

The present invention relates to a composition for forming an underlayer film between a substrate and a resist (such as a photoresist or an electron beam resist) for use in the manufacture of semiconductor devices. Specifically, the present invention relates to a resist underlayer film-forming composition for lithography for forming an underlayer film used as a layer under a photoresist in a lithography process for the manufacture of semiconductor devices. Furthermore, the present invention relates to a method for forming a resist pattern using the underlayer film-forming composition.

BACKGROUND ART

In the manufacture of semiconductor devices, fine processing by lithography using photoresists has been conventionally performed. The fine processing is a processing method including: forming a photoresist thin film on a semiconductor substrate such as a silicon wafer; irradiating the thin film with an active ray such as ultraviolet ray through a mask pattern having a semiconductor device pattern depicted therein; carrying out development; and etching the substrate with the obtained photoresist pattern as a protective film, thereby forming fine projections and depressions corresponding to the pattern, on the surface of the substrate. However, with the higher integration of semiconductor devices in recent years, an active ray to be used tends to have a shorter wavelength, namely, shift from KrF excimer laser (248 nm) to ArF excimer laser (193 nm). Accordingly, the influence of reflection of the active ray on a semiconductor substrate has become a serious problem.

A film known as a hard mask containing metal elements, such as silicon and titanium, has been used as an underlayer film between a semiconductor substrate and a photoresist. In this case, the photoresist and the hard mask are significantly different in components, and the rates to remove these by dry etching are greatly dependent on the types of gas used for dry etching. Therefore, the appropriate selection of a gas type allows the hard mask to be removed by dry etching without a large reduction in the film thickness of the photoresist. Thus, in the manufacture of semiconductor devices in recent years, a resist underlayer film has been increasingly disposed between a semiconductor substrate and a photoresist to achieve various effects such as an anti-reflection effect. Compositions for photoresist underlayer films have been studied, but, because of the diversity of characteristics demanded of the compositions, development of novel materials for photoresist underlayer films has been desired.

For example, a resist underlayer film comprising a polysiloxane including a silane having a sulfone structure has been proposed (refer to Patent Document 1).

A resist underlayer film comprising a polysiloxane including a silane having a sulfonamide structure has been proposed (refer to Patent Document 2).

A resist underlayer film comprising a polysiloxane including a silane having a sulfone structure and an amine structure has been proposed (refer to Patent Document 3).

PRIOR ART DOCUMENTS

Patent Documents

Patent Document 1: WO 2013/022099
Patent Document 2: WO 2011/033965
Patent Document 3: WO 2013/191203

SUMMARY OF THE INVENTION

Problem to be Solved by the Invention

It is an object of the present invention to provide a resist underlayer film-forming composition for lithography for use in the manufacture of semiconductor devices. Specifically, it is an object of the present invention to provide a resist underlayer film-forming composition for lithography for forming a resist underlayer film that can be used as a hard mask. Furthermore, it is an object of the present invention to provide a resist underlayer film-forming composition for lithography for forming a resist underlayer film that can be used as an anti-reflective coating. Furthermore, it is an object of the present invention to provide a resist underlayer film for lithography, in which the resist underlayer film does not intermix with a resist and a dry etching rate of the resist underlayer film can be made higher than that of the resist, and to provide a resist underlayer film-forming composition for forming the underlayer film.

In particular, it is an object of the present invention to provide a resist underlayer film-forming composition for forming a resist underlayer film that allows an excellent resist pattern shape to be formed when a resist as an upper layer is exposed to light and developed using an alkaline developing solution or an organic solvent, and that allows a rectangular resist pattern to be transferred to an underlayer by subsequent dry etching.

Means for Solving the Problem

The present invention provides:

according to a first aspect, a resist underlayer film-forming composition for lithography, the composition comprising, as a silane, a hydrolyzable silane, a hydrolysis product thereof, a hydrolysis-condensation product thereof, or a combination of these, in which the hydrolyzable silane comprises a hydrolyzable silane of Formula (1):

   Formula (1)

[where $R^1$ is an organic group of Formula (2):

   Formula (2)

(where $R^4$ is an optionally substituted $C_{1-10}$ alkylene group; $R^5$ is a sulfonyl group or a sulfonamide group; and $R^6$ is a halogen-containing organic group), and is bonded to a silicon atom through a Si—C bond; $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond; $R^3$ is an alkoxy group, an acyloxy group, or a halogen group; a is an integer of 1; b is an integer of 0 to 2; and a+b is an integer of 1 to 3];

according to a second aspect, the resist underlayer film-forming composition according to the first aspect, in which, in Formula (2), $R^6$ is a fluorine-containing organic group;

according to a third aspect, the resist underlayer film-forming composition according to the first aspect, in which, in Formula (2), $R^6$ is a trifluoromethyl group;

according to a fourth aspect, the resist underlayer film-forming composition according to the first aspect or the second aspect, in which, the hydrolyzable silane is a combination of the hydrolyzable silane of Formula (1) and another hydrolyzable silane, the other hydrolyzable silane being at least one hydrolyzable silane selected from the group consisting of a hydrolyzable silane of Formula (3):

  Formula (3)

(where $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^8$ is an alkoxy group, an acyloxy group, or a halogen group; and c is an integer of 0 to 3), and a hydrolyzable silane of Formula (4):

  Formula (4)

(where $R^9$ is an alkyl group and is bonded to a silicon atom through a Si—C bond; $R^{10}$ is an alkoxy group, an acyloxy group, or a halogen group; Y is an alkylene group or an arylene group; d is an integer of 0 or 1; and e is an integer of 0 or 1);

according to a fifth aspect, a resist underlayer film-forming composition, comprising, as an underlayer film-forming polymer, a hydrolysis-condensation product of a hydrolyzable silane comprising a combination of the hydrolyzable silane of Formula (1) according to the first aspect and the hydrolyzable silane of Formula (3) according to the fourth aspect;

according to a sixth aspect, the resist underlayer film-forming composition according to any one of the first aspect to the fifth aspect, further comprising an acid as a hydrolysis catalyst;

according to a seventh aspect, the resist underlayer film-forming composition according to any one of the first aspect to the sixth aspect, further comprising water;

according to an eighth aspect, a resist underlayer film obtained by applying the resist underlayer film-forming composition according to any one of the first aspect to the seventh aspect onto a semiconductor substrate, followed by baking;

according to a ninth aspect, a method for manufacturing a semiconductor device, the method comprising the steps of: applying the resist underlayer film-forming composition according to any one of the first aspect to the seventh aspect onto a semiconductor substrate, followed by baking to form a resist underlayer film; applying a resist composition onto the underlayer film to form a resist film; exposing the resist film to light; developing the resist film after the light exposure to obtain a resist pattern; etching the resist underlayer film with the resist pattern; and processing the semiconductor substrate with the patterned resist underlayer film; and according to a tenth aspect, a method for manufacturing a semiconductor device, the method comprising the steps of: forming an organic underlayer film on a semiconductor substrate; applying the resist underlayer film-forming composition according to any one of the first aspect to the seventh aspect onto the organic underlayer film, followed by baking to form a resist underlayer film; applying a resist composition onto the resist underlayer film to form a resist film; exposing the resist film to light; developing the resist film after the light exposure to obtain a resist pattern; etching the resist underlayer film with the resist pattern; etching the organic underlayer film with the patterned resist underlayer film; and processing the semiconductor substrate with the patterned organic underlayer film.

Effects of the Invention

The resist underlayer film-forming composition of the present invention can be used for the manufacture of semiconductor devices by lithography, and can function as a hard mask. This composition comprises, in a skeleton thereof, a hydrolyzable silane having sulfonyl or sulfonamide, and a halogen-containing organic group, and an underlayer film formed from the composition generates an acid by the irradiation of lasers with various wavelengths and electron beams, such as KrF, ArF, EUV, and EB. Accordingly, the composition is useful because the adjustment of the acidity of this underlayer film allows a resist shape to be controlled, so that the contrast of a photoresist can be made higher. In particular, in the case where the composition comprises a hydrolyzable silane having a trifluoromethanesulfone skeleton, an acid and a base can be characteristically generated particularly in EUV exposure, whereby pattern resolution can be improved.

Therefore, when the composition of the present invention is applied onto a semiconductor substrate or onto an organic underlayer film on the substrate, a resist underlayer film can be provided in which the resist underlayer film allows an excellent resist pattern shape to be formed by light-exposing a resist film, that is, an upper layer of the resist underlayer film, and developing the resist film by an alkaline developing solution or an organic solvent, and allows a rectangular resist pattern to be transferred to the underlayer of the resist film by subsequent dry etching. Furthermore, the resist underlayer film formed from the resist underlayer film-forming composition of the present invention can be used as an anti-reflective coating, and does not intermix with a resist and has a dry etching rate higher than that of the resist.

Therefore, the resist underlayer film-forming composition of the present invention can be used as, for example, resist underlayer film-forming compositions for ArF and KrF photoresists; resist underlayer film-forming compositions for EUV resists; EUV resist upperlayer film-forming compositions, resist underlayer film-forming compositions for electron beam resists; electron beam resist upperlayer film-forming compositions; and reverse material-forming compositions.

MODES FOR CARRYING OUT THE INVENTION

The present invention provides a resist underlayer film-forming composition for lithography, the composition comprising, as a silane, a hydrolyzable silane, a hydrolysis product thereof, a hydrolysis-condensation product thereof, or a combination of these, in which the hydrolyzable silane comprises a hydrolyzable silane of Formula (1).

In Formula (1), $R^1$ is an organic group of Formula (2) and bonded to a silicon atom through a Si—C bond. $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond. $R^3$ is an alkoxy group, an acyloxy group, or a halogen group. a is an integer of 1, b is an integer of 0 to 2, and a+b is an integer of 1 to 3.

In Formula (2), $R^4$ is an optionally substituted $C_{1-10}$ alkylene group, $R^5$ is a sulfonyl group or a sulfonamide group, and $R^6$ is a halogen-containing organic group.

$R^6$ in Formula (2) above is preferably a fluorine-containing organic group, and particularly preferably a trifluoromethyl group.

In the whole of the silane, the silane of Formula (1) may be used in a range of 50% by mole or less, 0.05% by mole to 50% by mole, 0.1% by mole to 30% by mole, or 0.1% by mole to 10% by mole.

The resist underlayer film-forming composition of the present invention comprises: the hydrolyzable silane of Formula (1), or the hydrolyzable silane of Formula (1) and another hydrolyzable silane (for example, a hydrolyzable silane of Formula (3)), a hydrolysis product thereof, or a hydrolysis-condensation product thereof, and a solvent. The resist underlayer film-forming composition may further comprise, as optional components, an acid, water, alcohol, a curing catalyst, an acid generator, other organic polymers, a light-absorbing compound, and a surfactant.

The resist underlayer film-forming composition of the present invention has a solid content of, for example, 0.1% by mass to 50% by mass, 0.1% by mass to 30% by mass, or 0.1% by mass to 25% by mass. Here, the solid content is a content obtained by subtracting solvent components from all components of the resist underlayer film-forming composition.

The proportion of the hydrolyzable silane, the hydrolysis product thereof, and the hydrolysis-condensation product thereof in the solid content is 20% by mass or more, for example, 50% by mass to 100% by mass, 60% by mass to 99% by mass, or 70% by mass to 99% by mass.

Furthermore, the above-mentioned hydrolyzable silane, the hydrolysis product thereof, and the hydrolysis-condensation product thereof may be used in the form of a mixture thereof. A condensation product obtained by hydrolyzing the hydrolyzable silane and condensing the resulting hydrolysis product may be used. Furthermore, a mixture may be used, obtained by mixing a hydrolysis-condensation product with a silane compound and a partial-hydrolysis product in which the hydrolysis to obtain the hydrolysis-condensation product has not been perfectly completed. Such condensation product is a polymer having a polysiloxane structure. This polysiloxane includes a hydrolysis-condensation product of the hydrolyzable silane of Formula (1), or the hydrolyzable silane of Formula (1) and another hydrolyzable silane (for example, the hydrolyzable silane of Formula (3)). Furthermore, the hydrolyzable silane of Formula (1), or a hydrolyzable silane formed of the combination of the hydrolyzable silane of Formula (1) and the hydrolyzable silane of Formula (3) may be added to a hydrolysis-condensation product (polysiloxane) of a hydrolysis product of the hydrolyzable silane of Formula (1) or a hydrolyzable silane formed of a combination of the hydrolyzable silane of Formula (1) and the hydrolyzable silane of Formula (3).

The above-mentioned alkyl group is a linear or branched $C_{1-10}$ alkyl group, and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Furthermore, a cyclic alkyl group may be used, and examples of a cyclic $C_{1-10}$ alkyl group include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. These examples are also applied to an alkyl group portion of the above-mentioned halogenated alkyl group.

The above-mentioned alkylene group may be, for example, alkylene groups derived from the above-mentioned alkyl groups. Examples of such alkylene groups include methylene group derived from methyl group, ethylene group derived from ethyl group, and propylene group derived from propyl group.

The above-mentioned alkenyl group is a $C_{2-10}$ alkenyl group, and examples of such alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl- 2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The above-mentioned aryl group is, for example, a $C_{6-20}$ aryl group, and examples of such aryl groups include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group. These examples are also applied to aryl group portions of the above-mentioned halogenated aryl group and the above-mentioned alkoxyaryl group.

Furthermore, examples of the above-mentioned arylene group include divalent organic groups derived from the above-mentioned aryl groups.

Examples of the above-mentioned organic group having an epoxy group include glycidoxymethyl, glycidoxyethyl, glycidoxypropyl, glycidoxybutyl, and epoxycyclohexyl.

Examples of the above-mentioned organic group having an acryloyl group include acryloylmethyl, acryloylethyl, and acryloylpropyl.

Examples of the above-mentioned organic group having a methacryloyl group include methacryloylmethyl, methacryloylethyl, and methacryloylpropyl.

Examples of the above-mentioned organic group having a mercapto group include ethylmercapto, butylmercapto, hexylmercapto, and octylmercapto.

Examples of the above-mentioned organic group having an amino group include aminomethyl, aminoethyl, and aminopropyl.

Examples of the above-mentioned organic group having a cyano group include cyanoethyl and cyanopropyl.

The above-mentioned alkoxy group is, for example, an alkoxy group having a linear, branched, or cyclic $C_{1-20}$ alkyl portion. Examples of such alkoxy groups include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group. These examples are also applied to an alkoxy group portion of the above-mentioned alkoxyaryl group.

Examples of the above-mentioned $C_{2-20}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-mentioned halogen group and a halogen group portion of the above-mentioned halogenated alkyl group or the halogenated aryl group include fluorine, chlorine, bromine, and iodine.

Examples of the halogen of the above-mentioned halogen-containing organic group include fluorine, chlorine, bromine, and iodine.

As the halogen-containing organic group, a halogen-containing organic group that is bonded to a sulfone or sulfonamide group, and a halogen-containing organic group that forms a salt structure may be used.

Furthermore, examples of the halogen-containing organic group include an alkyl group substituted with a halogen atom, and an organic group including an alkyl group substituted with a halogen atom. Examples of the alkyl group substituted with a halogen atom include perfluoromethyl group (that is, trifluoromethyl group), perfluoroethyl group, perfluoropropyl group, and perfluorobutyl group.

Examples of the hydrolyzable silane of Formula (1) are as follows.

Formula (1-1)
(TO)₃Si—CH₂CH₂CH₂—S(=O)₂—CF₃

Formula (1-2)
(TO)₃Si—CH₂—S(=O)₂—CF₃

Formula (1-3)
(TO)₃Si—CH₂CH₂CH₂—S(=O)₂—C₂F₅

Formula (1-4)
(TO)₃Si—CH₂—S(=O)₂—C₂F₅

Formula (1-5)
(TO)₃Si—CH₂CH₂CH₂—S(=O)₂—C₃F₇

Formula (1-6)
(TO)₃Si—CH₂—S(=O)₂—C₃F₇

Formula (1-7)
(TO)₃Si—CH₂CH₂CH₂—S(=O)₂—C₄F₉

Formula (1-8)
(TO)₃Si—CH₂—S(=O)₂—C₄F₉

Formula (1-9)
(TO)₃Si—CH₂CH₂CH₂—S(=O)₂—CCl₃

Formula (1-10)
(TO)₃Si—CH₂—S(=O)₂—CCl₃

Formula (1-11)
(TO)₃Si—CH₂CH₂CH₂—S(=O)₂—CBr₃

Formula (1-12)
(TO)₃Si—CH₂—S(=O)₂—CBr₃

Formula (1-13)
(TO)₃Si—CH₂CH₂CH₂—S(=O)₂—CI₃

Formula (1-14)
(TO)₃Si—CH₂—S(=O)₂—CI₃

Formula (1-15)
(TO)₃Si—CH₂CH₂CH₂—S(=O)₂—CF₂—CH₂—O—C(=O)—adamantyl

Formula (1-16)
(TO)₃Si—CH₂CH₂CH₂—S(=O)₂—(thiophen-2-yl, 5-Cl)

Formula (1-17)
(TO)₃Si—CH₂CH₂CH₂—S(=O)₂—(thiophen-2-yl, 5-Br)

Formula (1-18)
(TO)₃Si—CH₂CH₂CH₂—S(=O)₂—(thiophen-2-yl, 4-Br, 5-Cl)

Formula (1-19)
(TO)₃Si—CH₂CH₂CH₂—S(=O)₂—CH₂—(1,2,3-thiadiazol-4-yl, 5-Cl)

Formula (1-20)
(TO)₃Si—CH₂CH₂CH₂—S(=O)₂—CH₂—(thiazol-4-yl, 2-Cl, 5-Me)

Formula (1-21)
(TO)₃Si—CH₂CH₂CH₂—S(=O)₂—(1-methylimidazolium-4-yl)  F₃C—C(=O)—O⁻

Formula (1-22)
(TO)₃Si—CH₂CH₂CH₂—S(=O)₂—(1-methylimidazolium-4-yl)  F₃C—S(=O)₂—O⁻

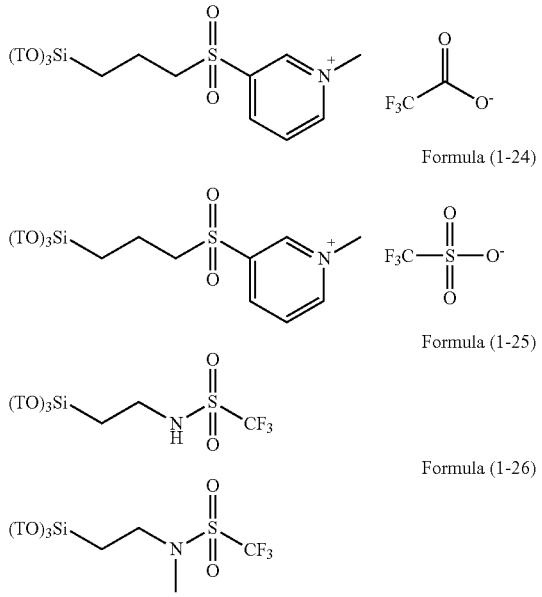

Formula (1-23)
Formula (1-24)
Formula (1-25)
Formula (1-26)

In the formulae above, T is a $C_{1-10}$ alkyl group, such as methyl group or ethyl group.

In the present invention, the hydrolyzable silane may be a combination of the hydrolyzable silane of Formula (1) and another hydrolyzable silane, in which the other hydrolyzable silane is at least one hydrolyzable silane selected from the group consisting of hydrolyzable silanes of Formula (3) and Formula (4).

Formula (3)

In Formula (3), $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^8$ is an alkoxy group, an acyloxy group, or a halogen group; and c is an integer of 0 to 3.

Formula (4)

In Formula (4), $R^9$ is an alkyl group and is bonded to a silicon atom through a Si—C bond; $R^{10}$ is an alkoxy group, an acyloxy group, or a halogen group; Y is an alkylene group or an arylene group; d is an integer of 0 or 1; and e is an integer of 0 or 1.

As the above-mentioned alkyl group, the aryl group, the halogenated alkyl group, the halogenated aryl group, the alkenyl group, the organic group having an epoxy group, an acryloyl group, a methacryloyl group, a mercapto group, or a cyano group, the alkoxy group, the acyloxy group, the halogen group, or the arylene group, the above-mentioned examples may be used.

Examples of the silicon-containing compound of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexypethyltrimethoxysilane, β-(3,4-epoxycyclohexypethyltriethoxysilane, β-(3,4-epoxycyclohexypethyltripropoxysilane, β-(3,4-epoxycyclohexypethyltributoxysilane, β-(3,4-epoxycyclohexypethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysi lane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Furthermore, the following hydrolyzable silanes may be used.

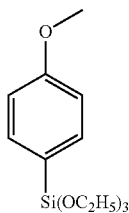

Formula (A-1)

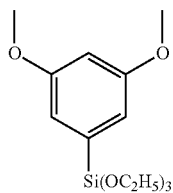

Formula (A-2)

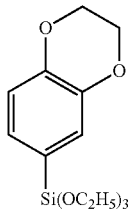

Formula (A-3)

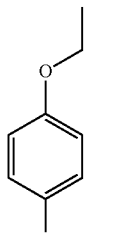

Formula (A-4)

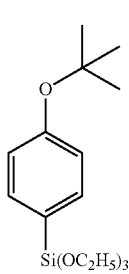

Formula (A-5)

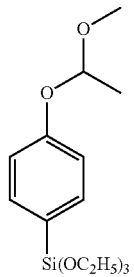

Formula (A-6)

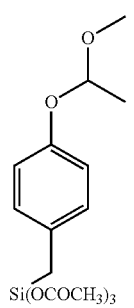

Formula (A-7)

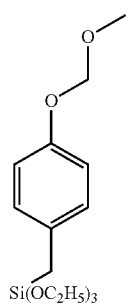

Formula (A-8)

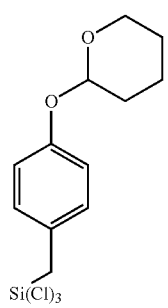

Formula (A-9)

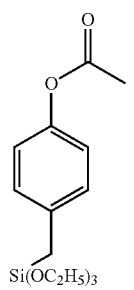

Formula (A-10)

Formula (A-11)
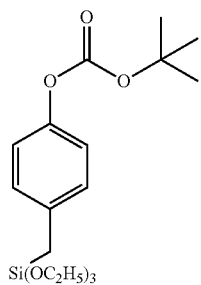
Formula (A-12)
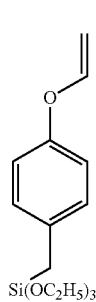
Formula (A-13)
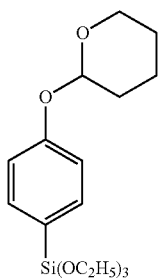
Formula (A-14)
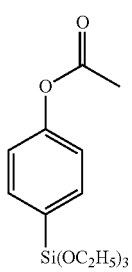
Formula (A-15)
Formula (A-16)
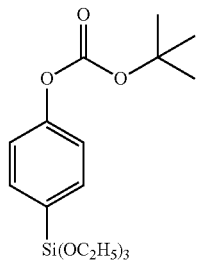
Formula (A-17)
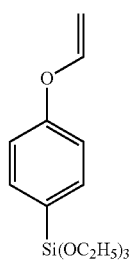
Formula (A-18)
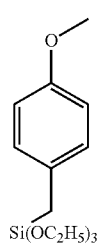
Formula (A-19)
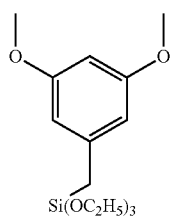
Formula (A-20)
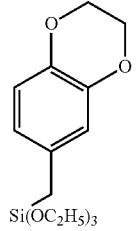
Formula (A-21)

Formula (A-22)
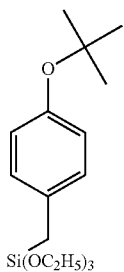
Formula (A-23)
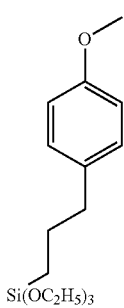
Formula (A-24)
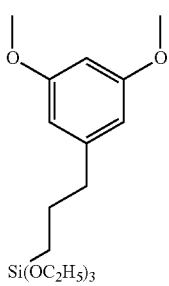
Formula (A-25)
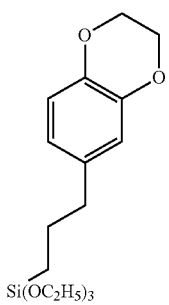
Formula (A-26)
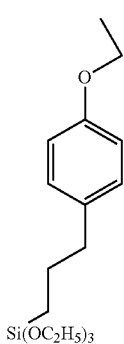
Formula (A-27)
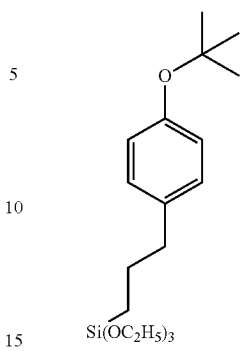
Formula (A-28)
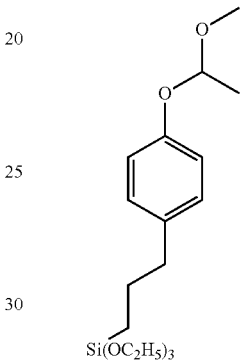
Formula (A-29)
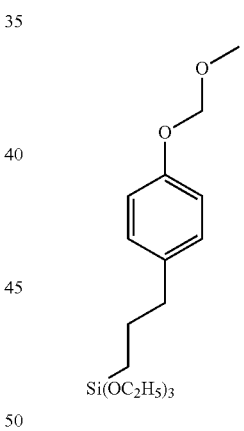
Formula (A-30)
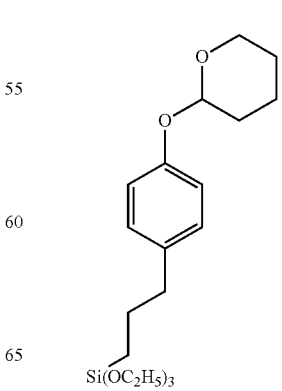

-continued
Formula (A-31)
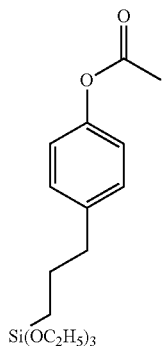
Formula (A-32)
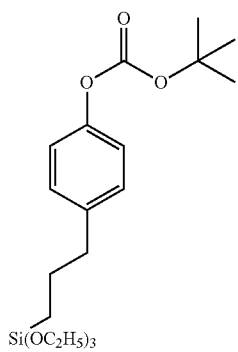
Formula (A-33)
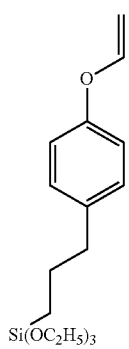
Formula (A-34)
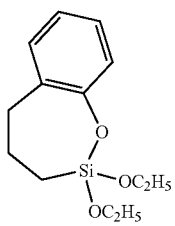
Formula (A-35)
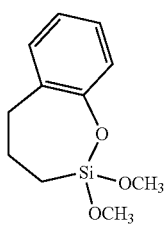
-continued
Formula (A-36)
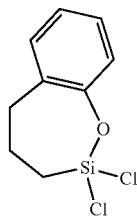
Formula (A-37)
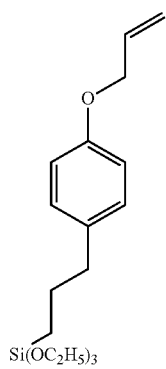
Formula (A-38)
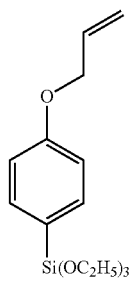
Formula (A-39)
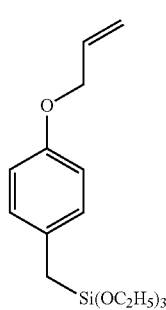
Formula (A-40)
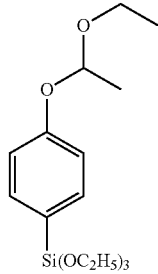

-continued

Formula (A-41)

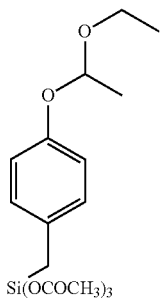

Formula (A-42)

Formula (A-43)

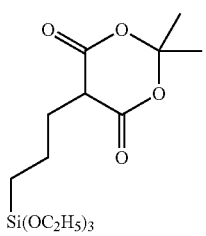

Formula (A-44)

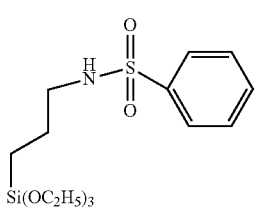

Formula (A-45)

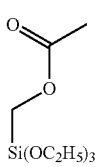

Formula (A-46)

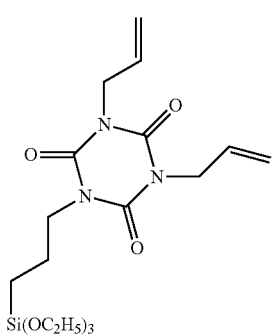

Examples of the silicon-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product (polysiloxane) used in the present invention are as follows.

Formula (3-1)

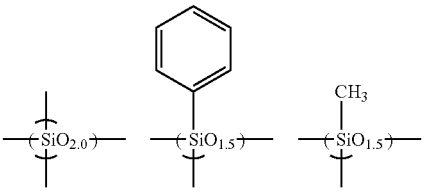

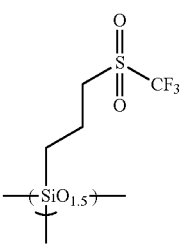

Formula (3-2)

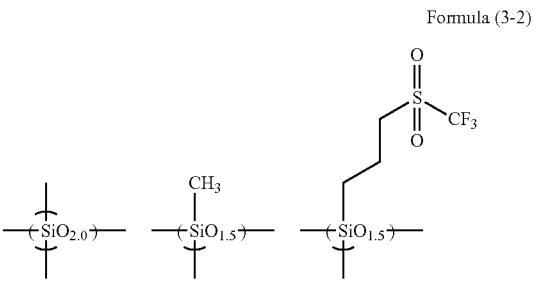

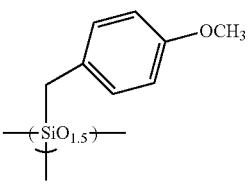

Formula (3-3)

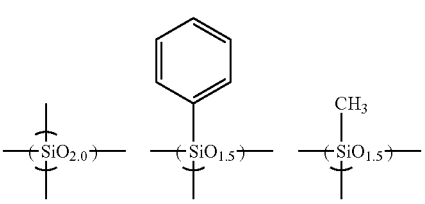

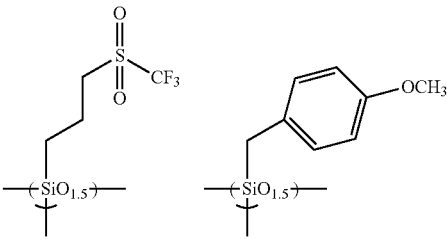

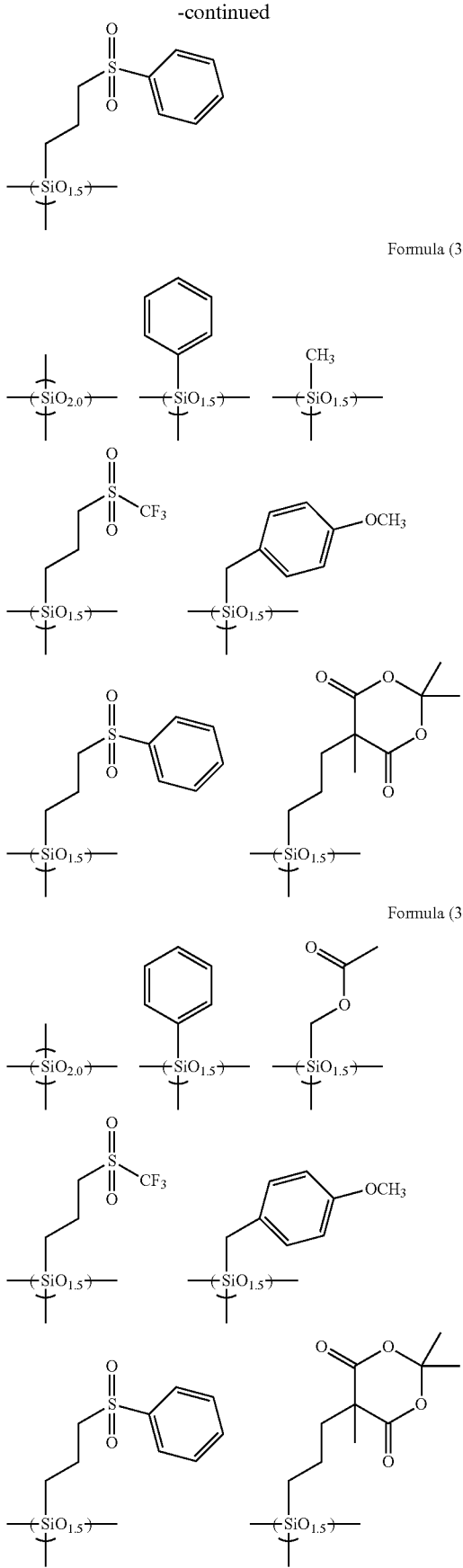
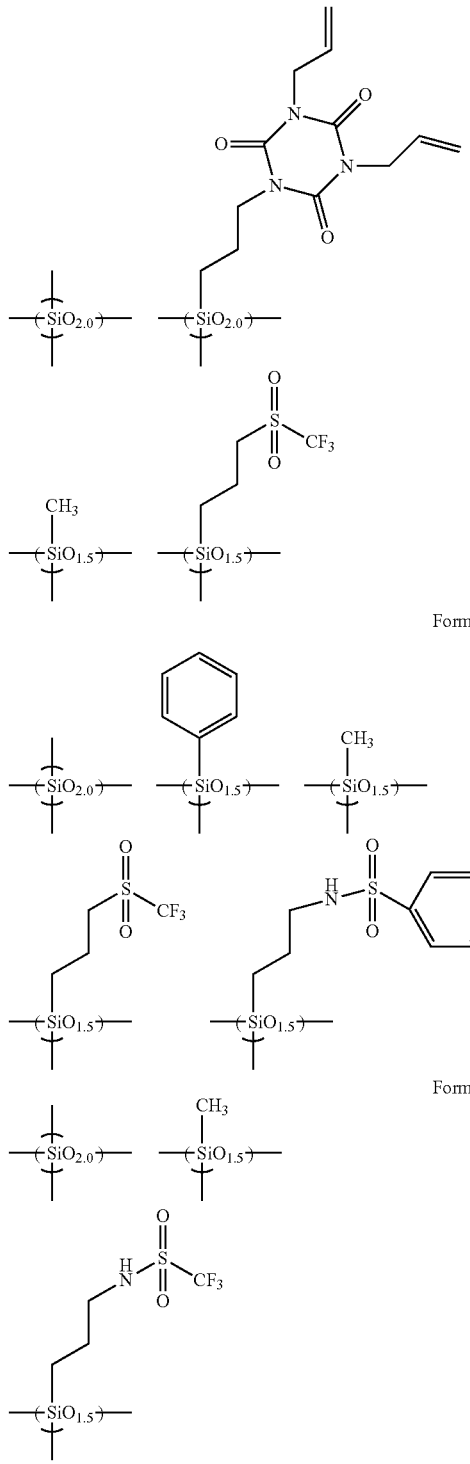
The hydrolysis-condensation product (polyorganosiloxane) of the hydrolyzable silane has a weight-average molecular weight of 1,000 to 1,000,000, or 1,000 to 100,000. These molecular weights are obtained by GPC analysis in terms of polystyrene.
The GPC measurement can be performed under conditions, such as the use of a GPC apparatus (trade name: HLC-8220GPC, manufactured by Tosoh Corporation), GPC columns (trade name: Shodex KF803L, KF802, and KF801, manufactured by Showa Denko K.K.), a column temperature of 40° C., tetrahydrofuran as an eluent (elution solvent), a flow amount (flow rate) of 1.0 ml/min, and a polystyrene (manufactured by Showa Denko K.K.) as a standard sample.

For the hydrolysis of an alkoxysilyl group, an acyloxysilyl group, or a halogenated silyl group, 0.5 mol to 100 mol, preferably 1 mol to 10 mol of water is used per mol of a hydrolysable group.

Furthermore, 0.001 mol to 10 mol, preferably 0.001 mol to 1 mol of a hydrolysis catalyst may be used per mol of a hydrolysable group.

The reaction temperature for hydrolysis and condensation is normally 20° C. to 80° C.

The hydrolysis may be either completely or partially performed. In other words, a hydrolysis product and a monomer may remain in a hydrolysis-condensation product.

A catalyst may be used for the hydrolysis and condensation.

Examples of the hydrolysis catalyst include metal chelate compounds, organic acids, inorganic acids, organic bases, and inorganic bases.

Examples of the metal chelate compounds serving as hydrolysis catalysts include: titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato)titanium, tri-t-butoxy mono(acetylacetonato)titanium, diethoxy bis(acetylacetonato)titanium, di-n-propoxy bis(acetylacetonato)titanium, di-i-propoxy bis(acetylacetonato)titanium, di-n-butoxy bis(acetylacetonato)titanium, di-sec-butoxy bis(acetylacetonato)titanium, di-t-butoxy bis(acetylacetonato)titanium, monoethoxy tris(acetylacetonato)titanium, mono-n-propoxy tris(acetylacetonato)titanium, mono-i-propoxy tris(acetylacetonato)titanium, mono-n-butoxy tris(acetylacetonato)titanium, mono-sec-butoxy tris(acetylacetonato)titanium, mono-t-butoxy tris(acetylacetonato)titanium, tetrakis(acetylacetonato)titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy bis(ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate)titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds, such as triethoxy mono(acetylacetonato)zirconium, tri-n-propoxy mono(acetylacetonato)zirconium, tri-i-propoxy mono(acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis(acetylacetonato)zirconium, di-n-propoxy bis(acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis(acetylacetonato)zirconium, monoethoxy tris(acetylacetonato)zirconium, mono-n-propoxy tris(acetylacetonato)zirconium, mono-i-propoxy tris(acetylacetonato)zirconium, mono-n-butoxy tris(acetylacetonato)zirconium, mono-sec-butoxy tris(acetylacetonato)zirconium, mono-t-butoxy tris(acetylacetonato)zirconium, tetrakis(acetylacetonato)zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono(ethylacetoacetate)zirconium, tri-sec-butoxy mono(ethylacetoacetate)zirconium, tri-t-butoxy mono(ethylacetoacetate)zirconium, diethoxy bis(ethylacetoacetate)zirconium, di-n-propoxy bis(ethylacetoacetate)zirconium, di-i-propoxy bis(ethylacetoacetate)zirconium, di-n-butoxy bis(ethylacetoacetate)zirconium, di-sec-butoxy bis(ethylacetoacetate)zirconium, di-t-butoxy bis(ethylacetoacetate)zirconium, monoethoxy tris(ethylacetoacetate)zirconium, mono-n-propoxy tris(ethylacetoacetate)zirconium, mono-i-propoxy tris(ethylacetoacetate)zirconium, mono-n-butoxy tris(ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of the organic acid serving as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as the hydrolysis catalyst include hydrochloric acid, nitric acid, sulfuric acid, hydrofluoric acid, and phosphoric acid.

Examples of the organic base serving as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compounds, the organic acids, and the inorganic acids are preferable, and these catalysts may be used alone or in combination of two or more kinds thereof.

Examples of the organic solvent used for the hydrolysis include: aliphatic hydrocarbon-based solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol-based solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol-based solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more kinds thereof.

In particular, ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone, are preferable in terms of the preservation stability of the solution.

Furthermore, bisphenol S or a bisphenol S derivative may be added as an additive. The amount of bisphenol S or a bisphenol S derivative added is 0.01 part by mass to 20 parts by mass, 0.01 part by mass to 10 parts by mass, or 0.01 part by mass to 5 parts by mass with respect to 100 parts by mass of polyorganosiloxane.

Preferable examples of the bisphenol S and the bisphenol S derivative are as follows.

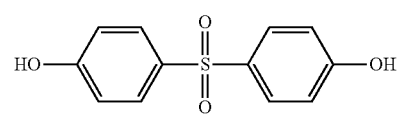

Formula (C-1)

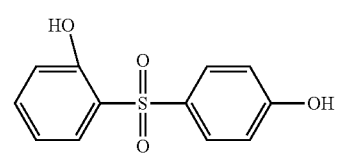

Formula (C-2)

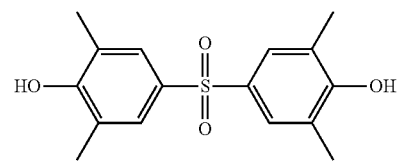

Formula (C-3)

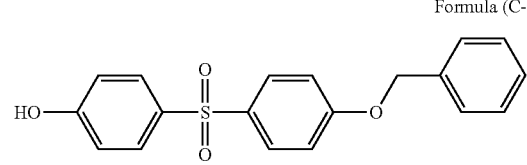

Formula (C-4)

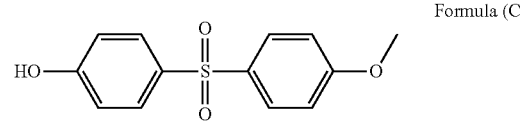

Formula (C-5)

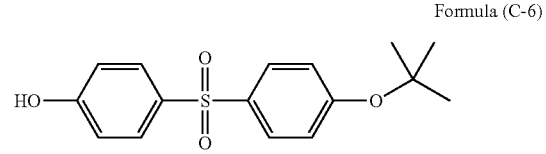

Formula (C-6)

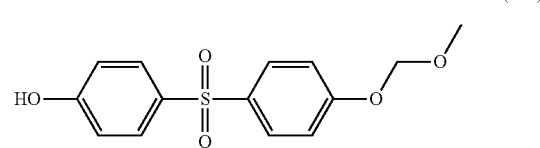

Formula (C-7)

Formula (C-8)
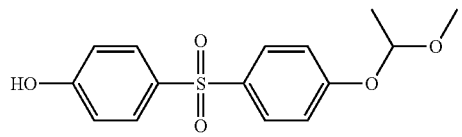

Formula (C-9)
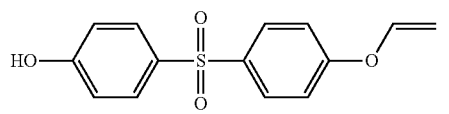

Formula (C-10)
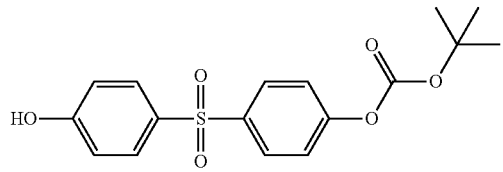

Formula (C-11)
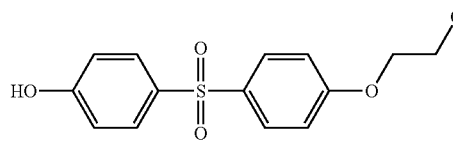

Formula (C-12)
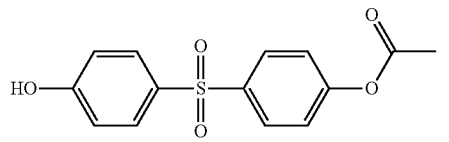

Formula (C-13)
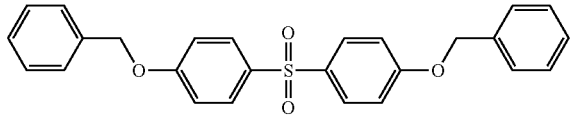

Formula (C-14)
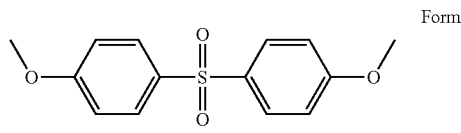

Formula (C-15)
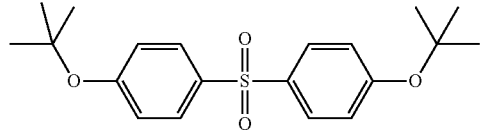

Formula (C-16)
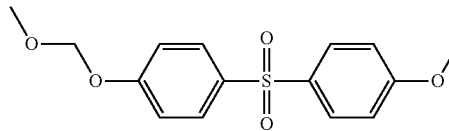

Formula (C-17)
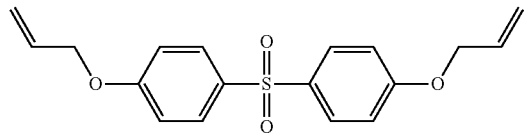

Formula (C-18)
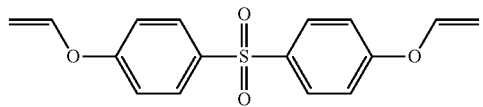

Formula (C-19)
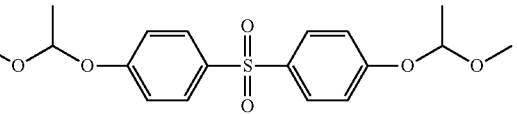

Formula (C-20)
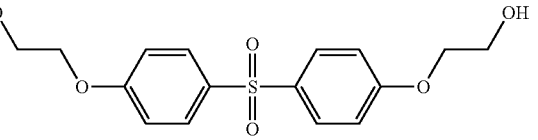

Formula (C-21)
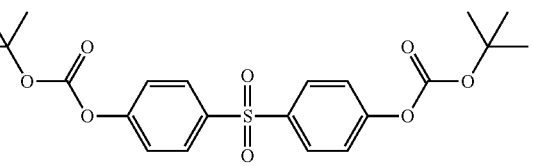

Formula (C-22)
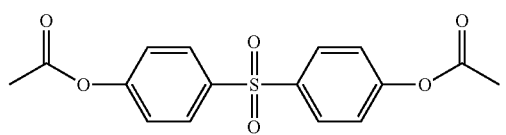

Formula C-23)
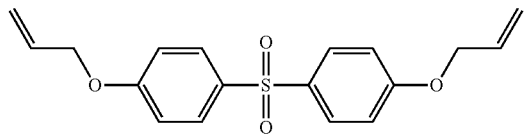

The resist underlayer film-forming composition of the present invention may include a curing catalyst. The curing catalyst acts as a curing catalyst when a coating film including a polyorganosiloxane formed of a hydrolysis-condensation product is heated and cured.

As the curing catalyst, ammonium salts, phosphines, phosphonium salts, and sulfonium salts may be used.

Examples of the ammonium salts include: a quaternary ammonium salt having a structure of Formula (D-1):

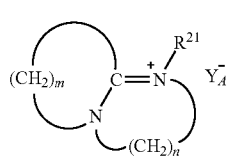

Formula (D-1)

(where m is an integer of 2 to 11; n is an integer of 2 or 3; $R^{21}$ is an alkyl group or an aryl group; and $Y_A^-$ is an anion);

a quaternary ammonium salt having a structure of Formula (D-2):

$$R^{22}R^{23}R^{24}R^{25}N^+ \ Y_A^-$$

Formula (D-2)

(where $R^{22}$, $R^{23}$, $R^{24}$, and $R^{25}$ are each an alkyl group or an aryl group; N is a nitrogen atom; $Y_A^-$ is an anion; and each of $R^{22}$, $R^{23}$, $R^{24}$, and $R^{25}$ is bonded to the nitrogen atom through a C—N bond);

a quaternary ammonium salt having a structure of Formula (D-3):

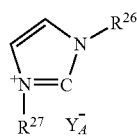

Formula (D-3)

(where $R^{26}$ and $R^{27}$ are each an alkyl group or an aryl group; and $Y_A^-$ is an anion);

a quaternary ammonium salt having a structure of Formula (D-4):

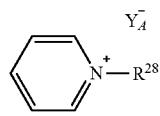

Formula (D-4)

(where $R^{28}$ is an alkyl group or an aryl group; and $Y_A^-$ is an anion);

a quaternary ammonium salt having a structure of Formula (D-5):

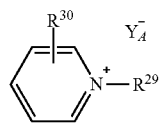

Formula (D-5)

(where $R^{29}$ and $R^{30}$ are each an alkyl group or an aryl group; and $Y_A^-$ is an anion); and a tertiary ammonium salt having a structure of Formula (D-6):

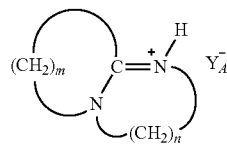

Formula (D-6)

(where m is an integer of 2 to 11; n is an integer of 2 or 3; H is a hydrogen atom; and $Y_A^-$ is an anion).

Examples of the phosphonium salts include a quaternary phosphonium salt of Formula (D-7):

$R^{31}R^{32}R^{33}R^{34}P^+Y_A^-$    Formula (D-7)

(where $R^{31}$, $R^{32}$, $R^{33}$, and $R^{34}$ are each an alkyl group or an aryl group; P is a phosphorus atom; $Y_A^-$ is an anion; and each of $R^{31}$, $R^{32}$, $R^{33}$, and $R^{34}$ is bonded to the phosphorus atom through a C—P bond).

Examples of the sulfonium salts include a tertiary sulfonium salt of Formula (D-8):

$R^{35}R^{36}R^{37}S^+Y_A^-$    Formula (D-8)

(where $R^{35}$, $R^{36}$, and $R^{37}$ are each an alkyl group or an aryl group; S is a sulfur atom; $Y_A^-$ is an anion; and each of $R^{35}$, $R^{36}$, and $R^{37}$ is bonded to the sulfur atom through a C—S bond).

The compound of Formula (D-1) above is a quaternary ammonium salt derived from an amine, and, in Formula (D-1), m is an integer of 2 to 11 and n is an integer of 2 or 3. $R^{21}$ of this quaternary ammonium salt is a $C_{1-18}$, preferably $C_{2-10}$ alkyl or aryl group. Examples of $R^{21}$ include linear alkyl groups, such as ethyl group, propyl group, and butyl group, benzyl group, cyclohexyl group, cyclohexylmethyl group, and dicyclopentadienyl group. Examples of the anion ($Y_A^-$) include: halide ions, such as chloride ion (Cl$^-$), bromide ion (Br$^-$), and iodide ion (I$^-$); and acid groups, such as carboxylate (—COO$^-$), sulfonate (—SO$_3$), and alcoholate (—O$^-$).

The compound of Formula (D-2) above is a quaternary ammonium salt having a structure of $R^{22}R^{23}R^{24}R^{25}N^+Y_A^-$. $R^{22}$, $R^{23}$, $R^{24}$, and $R^{25}$ of this quaternary ammonium salt are each a $C_{1-18}$ alkyl or aryl group, or a silane compound bonded to a silicon atom through a Si—C bond. Examples of the anion ($Y_A^-$) include: halide ions, such as chloride ion (Cl$^-$), bromide ion (Br$^-$), and iodide ion (I$^-$); and acid groups, such as carboxylate (—COO$^-$), sulfonate (—SO$_3^-$), and alcoholate (—O$^-$). This quaternary ammonium salt is commercially available, and examples of this quaternary ammonium salt include tetramethylammonium acetate, tetrabutylammonium acetate, benzyltriethylammonium chloride, benzyltriethylammonium bromide, methyltrioctylammonium chloride, benzyltributylammonium chloride, and benzyltrimethylammonium chloride.

The compound of Formula (D-3) is a quaternary ammonium salt derived from 1-substituted imidazole, and, in Formula (D-3), $R^{26}$ and $R^{27}$ are each a $C_{1-18}$ alkyl or aryl group, and the sum total of the number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y_A^-$) include: halide ions, such as chloride ion (Cl$^-$), bromide ion (Br$^-$), and iodide ion (I$^-$); and acid groups, such as carboxylate (—COO$^-$), sulfonate (—SO$_3^-$), and alcoholate (—O$^-$). Although this compound is commercially available, the compound can be produced by, for example, a reaction between an imidazole-based compound, such as 1-methylimidazole or 1-benzylimidazole, and an alkyl or aryl halide, such as benzyl bromide or methyl bromide.

The compound of Formula (D-4) above is a quaternary ammonium salt derived from pyridine, and in Formula (D-4), $R^{28}$ is a $C_{1-18}$, preferably $C_{4-18}$ alkyl or aryl group, and examples of $R^{28}$ include butyl group, octyl group, benzyl group, and lauryl group. Examples of the anion ($Y_A^-$) include: halide ions, such as chloride ion (Cl$^-$), bromide ion (Br$^-$), and iodide ion (I$^-$); and acid groups, such as carboxylate (—COO$^-$), sulfonate (—SO$_3^-$), and alcoholate (—O$^-$). Although this compound is commercially available, the compound can be produced by, for example, a reaction between pyridine and an alkyl or aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) above is a quaternary ammonium salt derived from a substituted pyridine, typified by picoline. In Formula (D-5), $R^{29}$ is a $C_{1-18}$, preferably $C_{4-18}$ alkyl or aryl group, and examples of $R^{29}$ include methyl group, octyl group, lauryl group, and benzyl group.

$R^{30}$ is a $C_{1-18}$ alkyl or aryl group, and, for example, in the case where the compound is a quaternary ammonium salt derived from picoline, $R^{30}$ is a methyl group. Examples of the anion ($Y_A^-$) include: halide ions, such as chloride ion (Cl⁻), bromide ion (Br⁻), and iodide ion (I⁻); and acid groups, such as carboxylate (—COO⁻), sulfonate (—SO₃⁻), and alcoholate (—O⁻). Although this compound is commercially available, the compound can be produced by, for example, a reaction between a substituted pyridine, such as picoline, and an alkyl or aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine, and, in Formula (D-6), m is an integer of 2 to 11 and n is an integer of 2 or 3. Examples of the anion ($Y_A^-$) include: halide ions, such as chloride ion (Cl⁻), bromide ion (Br⁻), and iodide ion (I⁻); and acid groups, such as carboxylate (—COO⁻), sulfonate (—SO₃⁻), and alcoholate (—O⁻). The compound can be produced by, for example, a reaction between an amine and a weak acid, such as a carboxylic acid or phenol. Examples of the carboxylic acid include formic acid and acetic acid. In the case of using formic acid, the anion ($Y_A^-$) is (HCOO⁻). In the case of using acetic acid, the anion ($Y_A^-$) is (CH₃COO⁻). Alternatively, in the case of phenol, the anion ($Y_A^-$) is ($C_6H_5O$).

The compound of Formula (D-7) above is a quaternary phosphonium salt having a structure of $R^{31}R^{32}R^{33}{}_RR^{34}P^+Y_A^-$. $R^{31}$, $R^{32}$, $R^{33}$, and $R^{34}$ are each a $C_{1-18}$ alkyl or aryl group, or a silane compound bonded to a silicon atom through a Si—C bond. Three of the four substituents, $R^{31}$ to $R^{34}$, are preferably a phenyl group or a substituted phenyl group, and examples of the substituents include phenyl group and tolyl group. The remaining one substituent is a $C_{1-18}$ alkyl or aryl group, or a silane compound bonded to a silicon atom through a Si—C bond. Examples of the anion ($Y_A^-$) include: halide ions, such as chloride ion (Cl⁻), bromide ion (Br⁻), and iodide ion (I⁻); and acid groups, such as carboxylate (—COO⁻), sulfonate (—SO₃⁻), and alcoholate (—O⁻). This compound is commercially available, and examples of the compound include: tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides, (in which a halogen atom is a chlorine atom or a bromine atom). In particular, triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (in which a halogen atom is a chlorine atom or a bromine atom), are preferable.

Examples of the phosphines include: primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) above is a tertiary sulfonium salt having a structure of $R^{35}R^{36}R^{37}S^+Y_A^-$. $R^{35}$, $R^{36}$, and $R^{37}$ are each a $C_{1-18}$ alkyl or aryl group, or a silane compound bonded to a silicon atom through a Si—C bond. Three of the four substituents, $R^{35}$ to $R^{37}$, are preferably a phenyl group or a substituted phenyl group, and examples of the substituents include phenyl group and tolyl group. The remaining one substituent is a $C_{1-18}$ alkyl or aryl group. Examples of the anion ($Y_A^-$) include: halide ions, such as chloride ion (Cl⁻), bromide ion (Br⁻), and iodide ion (I⁻); and acid groups, such as carboxylate (—COO), sulfonate (—SO₃⁻), alcoholate (–OD, maleic acid anion, and nitric acid anion. This compound is commercially available, and examples of the compound include: tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; and triphenylsulfonium halides (in which a halogen atom is a chlorine atom or a bromine atom); tetraalkylphosphonium carboxylates, such as tri-n-butylsulfonium carboxylate and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate are preferably used.

Furthermore, in the present invention, a nitrogen-containing silane compound may be added as a curing catalyst. Examples of the nitrogen-containing silane compound include an imidazole-ring-containing silane compound, such as N-(3-triethoxysilylpropyl)-4,5-dihydroimidazole.

The amount of the curing catalyst added is 0.01 part by mass to 10 parts by mass, 0.01 part by mass to 5 parts by mass, or 0.01 part by mass to 3 parts by mass with respect to 100 parts by mass of polyorganosiloxane.

From a hydrolysis-condensation product (a polymer) obtained by hydrolyzing and condensing a hydrolyzable silane using a catalyst in a solvent, alcohols as by-products, the used hydrolysis catalyst, and water can be removed at the same time by, for example, distillation under reduced pressure. Furthermore, an acid and base catalyst each used in the hydrolysis can be removed by neutralization or ion exchange. In the resist underlayer film-forming composition for lithography of the present invention, an organic acid, water, and alcohols, or a combination thereof may be added to the resist underlayer film-forming composition including the hydrolysis-condensation product for the purpose of stabilization.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among these, oxalic acid and maleic acid are preferable. The amount of the organic acid added is 0.1 part by mass to 5.0 parts by mass with respect to 100 parts by mass of the condensation product (polyorganosiloxane). Furthermore, pure water, ultrapure water, and ion exchange water may be used as the water to be added, and the amount of the water added may be 1 part by mass to 20 parts by mass with respect to 100 parts by mass of the resist underlayer film-forming composition.

As the alcohol to be added, alcohol that easily disperses by heating after the application is preferable, and examples of the alcohol include methanol, ethanol, propanol, isopropanol (2-propanol), and butanol. The amount of the alcohol added may be 1 part by mass to 20 parts by mass with respect to 100 parts by mass of the resist underlayer film-forming composition.

Besides the above-mentioned components, the underlayer film-forming composition for lithography of the present invention may contain an organic polymer compound, a photoacid generator, and a surfactant, as necessary.

The use of an organic polymer compound allows the adjustment of the dry etching rate (the amount of reduction in film thickness per unit time), the attenuation coefficient, and the refractive index of a resist underlayer film formed from the underlayer film-forming composition for lithography of the present invention.

The organic polymer compound is not limited to a particular compound, and various kinds of organic polymers may be used. For example, polycondensation polymers and addition polymerization polymers may be used. The addition polymerization polymers and the polycondensation polymers to be used include polyesters, polystyrenes, polyimides, acrylic polymers, methacrylic polymers, polyvinyl ethers, phenol novolacs, naphthol novolacs, polyethers, polyamides, and polycarbonates may be used. Organic polymers having aromatic ring structures that function as a light absorbing portion, such as a benzene ring, a naphthalene ring, an anthracene ring, a triazine ring, a quinoline ring, and a quinoxaline ring, are preferably used.

Examples of such organic polymer compound include: addition polymerization polymers including, as a structural unit thereof, addition polymerizable monomers, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers, such as phenol novolacs and naphthol novolacs.

In the case where an addition polymerization polymer is used as the organic polymer compound, the polymer compound may be a homopolymer or a copolymer. For the manufacture of the addition polymerization polymer, an addition polymerizable monomer is used. Examples of such addition polymerizable monomer include acrylic acid, methacrylic acid, an acrylic ester compound, a methacrylic ester compound, an acrylamide compound, a methacrylamide compound, a vinyl compound, a styrene compound, a maleimide compound, a maleic anhydride, and acrylonitrile.

Examples of the acrylic ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyl trimethoxy silane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

In the case of using a polycondensation polymer as the polymer, examples of such polymer include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride.

Examples of the polycondensation polymer include polyesters, polyamides, and polyimides, such as polypyromellitic imides, poly(p-phenyleneterephthalamide)s, polybutylene terephthalates, and polyethylene terephthalates.

In the case where the organic polymer compound has a hydroxy group, this hydroxy group can cause a crosslinking reaction with a polyorganosiloxane.

As the organic polymer compound, a polymer compound having a weight average molecular weight of, for example, 1,000 to 1,000,000, 3,000 to 300,000, 5,000 to 200,000, or 10,000 to 100,000 may be used.

The organic polymer compound may be used alone or in combination of two or more kinds thereof.

In the case of using the organic polymer compound, the amount of the organic polymer compound used is 1 part by mass to 200 parts by mass, 5 parts by mass to 100 parts by mass, 10 parts by mass to 50 parts by mass, or 20 parts by mass to 30 parts by mass with respect to 100 parts by mass of the condensation product (polyorganosiloxane).

The resist underlayer film-forming composition of the present invention may include an acid generator.

Examples of the acid generator include thermal acid generators and photoacid generators.

Photoacid generators generate an acid at the time of the light-exposure of a resist. Thus, the acidity of an underlayer film can be adjusted. This is one method for adjusting the acidity of an underlayer film to the acidity of a resist serving as an upper layer of the underlayer film. Furthermore, the adjustment of acidity of an underlayer film allows the pattern shape of a resist formed as an upper layer of the underlayer film to be adjusted.

Examples of the photoacid generator included in the resist underlayer film-forming composition of the present invention include an onium salt compound, a sulfonimide compound, and a disulfonyldiazomethane compound.

Examples of the onium salt compound include: iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methyl sulfonyl-p-toluenesulfonyldiazomethane.

The photoacid generator may be used alone or in combination of two or more kinds thereof.

In the case of using the photoacid generator, the amount of the photoacid generator used is 0.01 part by mass to 15 parts by mass, 0.1 part by mass to 10 parts by mass, or 0.5 part by mass to 1 part by mass with respect to 100 parts by mass of the condensation product (polyorganosiloxane).

Surfactants effectively suppress the formation of pinholes and striations when the resist underlayer film-forming composition for lithography of the present invention is applied to a substrate.

Examples of a surfactant included in the resist underlayer film-forming composition of the present invention include: nonionic surfactants, such as polyoxyethylene alkyl ethers including polyoxyethylene lauryl ether, polyoxyethylene stearyl ether, polyoxyethylene cetyl ether, and polyoxyethylene oleyl ether, polyoxyethylene alkylallyl ethers including polyoxyethylene octylphenol ether and polyoxyethylene nonylphenol ether, polyoxyethylene-polyoxypropylene block copolymers, sorbitan fatty acid esters, including sorbitan monolaurate, sorbitan monopalmitate, sorbitan monostearate, sorbitan monooleate, sorbitan trioleate, and sorbitan tristearate, polyoxyethylene sorbitan fatty acid esters, including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorine-based surfactants, such as the trade names EFTOP EF301, EF303, and EF352 (manufactured by Tohkem Products Corporation), the trade names MEGAFAC F171, F173, R-08, R-30, R-30N, and R-40LM (manufactured by DIC Corporation), Fluorad FC430 and FC431 (manufactured by Sumitomo 3M Limited), the trade name Asahi Guard AG710 and the trade names SURFLON S-382, SC101, SC102, SC103, SC104, SC105, and SC106 (manufactured by Asahi Glass Co., Ltd.); and an organosiloxane polymer KP341 (manufactured by Shin-Etsu Chemical Co., Ltd.). These surfactants may be used alone or in combination of two or more kinds thereof. In the case of using the surfactant, the amount of the surfactant used is 0.0001 part by mass to 5 parts by mass, 0.001 part by mass to 1 part by mass, or 0.01 part by mass to 1 part by mass with respect to 100 parts by mass of the condensation product (polyorganosiloxane).

Furthermore, to the resist underlayer film-forming composition of the present invention, for example, a rheology controlling agent and an adhesion assistant may be added. A rheology controlling agent effectively improves the fluidity of the underlayer film-forming composition. An adhesion assistant effectively improves the adhesion between a semiconductor substrate or a resist and an underlayer film.

As the solvent used for the resist underlayer film-forming composition of the present invention, a solvent capable of dissolving the above-mentioned solid contents may be used without particular limitations. Examples of such solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxy propionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more kinds thereof.

Hereinafter, the use of the resist underlayer film-forming composition of the present invention is described.

Using the resist underlayer film-forming composition of the present invention, a resist underlayer film is formed on a substrate by application, or is formed via an organic underlayer film on a substrate by application onto the organic underlayer film, and then, a resist film (for example, photoresist or electron beam resist) is formed on the resist underlayer film. Then, a resist pattern is formed by exposure and development. Using the resist pattern, the resist underlayer film is dry-etched to perform the transfer of the pattern, and the substrate is processed using the pattern, or the organic underlayer film is etched to perform the transfer of the pattern, and the substrate is processed using the organic underlayer film.

In the formation of a fine pattern, the film thickness of a resist tends to be made thinner for the purpose of preventing pattern collapse. Due to such a thinner resist film, the etching rate of dry etching for transferring a pattern to a film presents under the resist film needs to be higher than the etching rate of the upper layer film in order to perform the transfer of the pattern. In the present invention, a resist underlayer film (containing an inorganic silicon-based compound) of the present invention is coated on a substrate via an organic underlayer film or not via an organic underlayer film, and a resist film (an organic resist film) is coated thereon in this order. Depending on a selected etching gas, a film of an organic component and a film of an inorganic component considerably differ in dry etching rate. With the use of an oxygen-based gas, a film of an organic component is dry-etched at a higher rate. In contrast, with the use of a halogen-containing gas, a film of an inorganic component is dry-etched at a higher rate.

For example, a resist pattern is formed, and a resist underlayer film of the present invention under the resist pattern is dry-etched using a halogen-containing gas to transfer the resist pattern to the resist underlayer film. Using the resist pattern transferred to the resist underlayer film, a substrate is processed using a halogen-containing gas. Alternatively, using the resist underlayer film to which the resist pattern is transferred, an organic underlayer film present under the resist underlayer film is dry-etched using an oxygen-based gas to transfer the resist pattern to the organic underlayer film. Using the organic underlayer film to which the resist pattern is transferred, a substrate is processed using a halogen-containing gas.

Here, onto a substrate used for the manufacture of a semiconductor device (for example, a silicon wafer substrate, a silicon/silicon-dioxide coated substrate, a silicon nitride substrate, a glass substrate, an ITO substrate, a polyimide substrate, or a low dielectric constant material (low-k material) coated substrate), the resist underlayer film-forming composition of the present invention is applied by appropriate application means, such as a spinner and a coater, followed by baking to form a resist underlayer film. The baking is performed under the conditions appropriately selected from heating temperatures of 80° C. to 250° C. and heating duration of 0.3 minute to 60 minutes. The baking temperature is preferably 150° C. to 250° C., and the heating duration is preferably 0.5 minute to 2 minutes. Here, the thickness of the underlayer film formed is, for example, 10 nm to 1,000 nm, 20 nm to 500 nm, 50 nm to 300 nm, or 100 nm to 200 nm.

Next, a photoresist layer, for example, is formed on the resist underlayer film. The photoresist layer can be formed by a well-known process, that is, the application of a solution of a photoresist composition onto the underlayer film, followed by baking. The film thickness of the photoresist layer is, for example, 50 nm to 10,000 nm, 100 nm to 2,000 nm, or 200 nm to 1,000 nm.

In the present invention, an organic underlayer film can be formed on a substrate, the resist underlayer film of the present invention can then be formed on the organic underlayer film, and furthermore, a photoresist can be coated on the resist underlayer film. This allows the pattern width of the photoresist to be narrower, and accordingly, even when the photoresist is applied thinly for the purpose of preventing pattern collapse, selecting an appropriate etching gas allows the substrate to be processed. For example, the use of a fluorine-based gas as an etching gas, which results in a significantly high etching rate for a photoresist, allows the resist underlayer film of the present invention to be processed. In contrast, the use of an oxygen-based gas as an etching gas, which results in a significantly high etching rate for the resist underlayer film of the present invention, allows an organic underlayer film to be processed. Furthermore, the use of a fluorine-based gas as an etching gas, which results in a significantly high rate for the organic underlayer film, allows a substrate to be processed.

The photoresist formed on the resist underlayer film of the present invention is not limited to a particular one as long as the photoresist is sensitive to light used for exposure. Both negative and positive photoresists may be used. Examples of the photoresist include a positive photoresist formed of a novolac resin and a 1,2-naphthoquinone diazide sulfonic acid ester; a chemically amplified photoresist formed of a binder having a group that is decomposed by acid to increase an alkali dissolution rate and a photoacid generator; a chemically amplified photoresist formed of a low molecular weight compound that is decomposed by acid to increase an alkali dissolution rate of the photoresist, an alkali-soluble binder, and a photoacid generator; and a chemically amplified photoresist formed of a binder having a group that is decomposed by acid to increase an alkali dissolution rate, a low molecular weight compound that is decomposed by acid to increase an alkali dissolution rate of the photoresist, and a photoacid generator. Examples of the photoresists include the trade name APEX-E, manufactured by Shipley, the trade name PAR710, manufactured by Sumitomo Chemical Company, Limited, and the trade name SEPR430, manufactured by Shin-Etsu Chemical Co., Ltd. Furthermore, examples of the photoresists include fluorine-atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, light exposure is performed through a predetermined mask. For the light exposure, for example, a KrF excimer laser (with a wavelength of 248 nm), an ArF excimer laser (with a wavelength of 193 nm), or an F2 excimer laser (with a wavelength of 157 nm) may be used. After the light exposure, post exposure bake may be performed, if necessary. The post exposure bake is performed under the conditions appropriately selected from heating temperatures of 70° C. to 150° C. and heating duration of 0.3 minute to 10 minutes.

In the present invention, a resist for electron beam lithography or a resist for EUV lithography may be used as a resist in place of a photoresist. Both positive and negative electron beam resists may be used. Examples of the electron beam resists include a chemically amplified resist formed of an acid generator and a binder having a group that is decomposed by acid to change an alkali dissolution rate; a chemically amplified resist formed of an alkali-soluble binder, an acid generator, and a low molecular weight compound that is decomposed by acid to change an alkali dissolution rate of the resist; a chemically amplified resist formed of an acid generator, a binder having a group that is decomposed by acid to change an alkali dissolution rate, and a low molecular weight compound that is decomposed by acid to change an alkali dissolution rate of the resist; a non-chemically amplified resist formed of a binder having a group that is decomposed by an electron beam to change an alkali dissolution rate; and a non-chemically amplified resist formed of a binder having a portion that is cut by an electron beam to change an alkali dissolution rate. Also, in the cases of using these electron beam resists, a resist pattern can be formed using an electron beam as an irradiation source in the same manner as in the case of using a photoresist.

As the EUV resist, methacrylate resin-based resists, methacrylate-polyhydroxystyrene hybrid resin-based resists, and polyhydroxystyrene resin-based resists may be used. Both negative and positive resists may be used as the EUV resist. Examples of the resist include a chemically amplified resist including an acid generator and a binder having a group decomposed by acid to change an alkali dissolution rate; a chemically amplified resist including an alkali-soluble binder, an acid generator, and a low molecular weight compound decomposed by acid to change the alkali dissolution rate of the resist; a chemically amplified resist including an acid generator, a binder having a group decomposed by acid to change an alkali dissolution rate, and a low molecular weight compound decomposed by acid to change the alkali dissolution rate of the resist; a non-chemically amplified resist including a binder having a group decomposed by EUV light to change an alkali dissolution rate; and a non-chemically amplified resist including a binder having a portion cut by EUV light to change an alkali dissolution rate.

Next, development is performed using a developing solution (for example, an alkaline developing solution). Thus, for example, in the case of using a positive photoresist, an exposed portion of the photoresist is removed to form a pattern of the photoresist.

Examples of the developing solution include alkaline solutions, such as: aqueous solutions of an alkali metal hydroxide, such as potassium hydroxide and sodium hydroxide; aqueous solutions of a quaternary ammonium hydroxide, such as tetramethyl ammonium hydroxide, tetraethyl ammonium hydroxide, and choline; and aqueous solutions of an amine, such as ethanolamine, propylamine, and ethylenediamine. Furthermore, a surfactant or other substances may be added to these developing solutions. The development conditions are appropriately selected from temperatures of 5° C. to 50° C. and duration of 10 seconds to 600 seconds.

Furthermore, in the present invention, an organic solvent may be used as a developing solution. After the light exposure, development is performed using a developing solution (a solvent). Thus, for example, in the case of using a positive photoresist, an unexposed portion of the photoresist is removed to form a pattern of the photoresist.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxy butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxy propionate, ethyl-3-methoxy propionate, ethyl-3-ethoxy propionate, and propyl-3-methoxy propionate. Furthermore, a surfactant or other substances may be added to these developing solutions. The development conditions are appropriately selected from temperatures of 5° C. to 50° C. and duration of 10 seconds to 600 seconds.

Then, using the thus-formed pattern of the photoresist (upper layer) as a protective film, the photoresist underlayer film (intermediate layer) of the present invention is removed. Subsequently, using a film formed of the patterned photoresist and the patterned resist underlayer film (intermediate layer) of the present invention as protective films, an organic underlayer film (lower layer) is removed. Finally, using the patterned resist underlayer film (intermediate layer) of the present invention and the patterned organic underlayer film (lower layer) as protective films, a semiconductor substrate is processed.

First, a photoresist-removed portion of the resist underlayer film (intermediate layer) of the present invention is removed by dry etching to make a semiconductor substrate exposed. For the dry etching of the resist underlayer film of the present invention, gases, such as tetrafluoromethane ($CF_4$), parfluorocyclobutane ($C_4F_8$), parfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane may be used. For the dry etching of the resist underlayer film, a halogen-based gas is preferably used. With dry etching using a halogen-based gas, a photoresist formed of an organic substance is basically hard to remove. In contrast, the resist underlayer film of the present invention that contains many silicon atoms is promptly removed by a halogen-based gas. Thus, a reduction in the film thickness of the photoresist that is associated with the dry etching of the resist underlayer film can be suppressed. As a result, a thinner photoresist film can be used. The dry etching of the resist underlayer film is preferably performed using a fluorine-based gas. Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

After that, using films formed of the patterned photoresist and the patterned resist underlayer film of the present invention as protective films, the organic underlayer film is removed. The dry etching of the organic underlayer film (lower layer) is preferably performed using an oxygen-based gas. This is because the resist underlayer film of the present invention that contains many silicon atoms is hard to remove by dry etching using an oxygen-based gas.

Finally, a semiconductor substrate is processed. The processing of the semiconductor substrate is preferably performed by dry etching using a fluorine-based gas.

Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

Furthermore, on the resist underlayer film of the present invention, an organic anti-reflective coating may be formed before the formation of a photoresist. An anti-reflective coating composition used for the anti-reflective coating is not limited to a particular one, and may be appropriately selected from various anti-reflective coating compositions that have been commonly used for lithography process. Furthermore, the anti-reflective coating may be formed using a common method, for example, application with a spinner or a coater and baking.

The substrate to which the resist underlayer film-forming composition of the present invention is applied may have an organic or inorganic anti-reflective coating formed thereon by a CVD process or the like, and furthermore, on the anti-reflective coating, a resist underlayer film formed from the resist underlayer film-forming composition of the present invention may be formed.

In the present invention, the resist underlayer film functions as a hard mask. In any developing process in any generation lithography, the acidity of an underlayer film needs to be adjusted for the purpose of controlling the shape of a resist. In particular, the skeleton of the hydrolyzable silane that is incorporated into the composition of the present invention so as to generate an acid by the irradiation of lasers and electron beams with various wavelengths, such as KrF, ArF, EUV, and EB, can contribute to a higher contrast of a photoresist, and is therefore useful. In particular, when the composition has a trifluoromethanesulfone skeleton, an acid and a base can be characteristically generated particularly in EUV exposure, and thus, pattern resolution can be improved.

Sometimes, depending on the wavelength of light used in a lithography process, the resist underlayer film formed from the resist underlayer film-forming composition of the present invention absorbs the light. In this case, the resist underlayer film can function as an anti-reflective coating having the effect of preventing light reflected from a substrate. Furthermore, the underlayer film formed from the resist underlayer film-forming composition of the present invention can be used as, for example, a layer for preventing the interaction between a substrate and a photoresist; a layer having the function of preventing a material used for a photoresist or a substance produced at the time of exposing a photoresist to light from having an adverse effect on a substrate; a layer having the function of preventing a substance produced in a substrate at the time of heating and baking from diffusing to a photoresist serving as an upper layer; and a barrier layer for reducing the effect of poisoning a photoresist layer by a dielectric layer on a semiconductor substrate; or the like.

Furthermore, the resist underlayer film not only can function as a hard mask, but can also be used as an EUV resist underlayer film for the purpose below. That is, the resist underlayer film-forming composition can be used for an anti-reflective EUV resist underlayer coating that is capable of, without intermixing with an EUV resist, preventing exposure light undesirable for EUV exposure (wavelength of 13.5 nm), such as above-mentioned UV and DUV (ArF laser, KrF laser), from reflecting from a substrate or an interface. The reflection can be efficiently prevented in the underlayer of the EUV resist. In the case where the resist underlayer film is used as an EUV resist underlayer film, the film can be processed in the same manner as for the underlayer film for photoresists.

Furthermore, the resist underlayer film formed from the resist underlayer film-forming composition of the present invention can be applied to a substrate having via holes formed therein for use in the dual-damascene process, and can be used as an embedding material to fill up the holes. Furthermore, the resist underlayer film can be used as a flattening material to make the surface of a semiconductor substrate having projections and depressions flat.

EXAMPLES

Synthesis of Compound 1/trifluoromethanesulfonylpropyltriethoxysilane

Into a 500-ml short-neck flask, 28.00 g (0.116 mol) of 3-chloropropyltriethoxysilane, 23.59 g (0.152 mol) of sodium trifluoromethanesulfinate, 8.59 g (0.023 mol) of tetrabutylammonium iodide (TBAI), 84.00 g of toluene, and 28.00 g of N-methylpyrrolidone (NMP) were introduced, and heated to 100° C. to effect the reaction for 24 hours. The resultant reaction solution was subjected to liquid separation using toluene and water, and then, toluene was removed by an evaporator to obtain a crude product. The crude product was subjected to distillation under reduced pressure to obtain a target, Compound 1 (trifluoromethanesulfonylpropyltriethoxysilane).

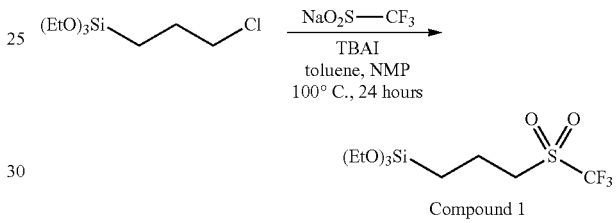

Compound 1

$^1$H-NMR (500 MHz, DMSO-d$_6$): 0.78 ppm (m, 2H), 1.16 ppm (t, 9H), 1.84 ppm (m, 2H), 3.78 ppm (m, 8H) 13C-NMR (500 MHz, DMSO-d$_6$): 8.6 ppm, 15.3 ppm, 18.1 ppm, 50.6 ppm, 57.9 ppm, 119.2 ppm (q)

Synthesis of Compound 2/methanesulfonylpropyltriethoxysilane

Into a 500-ml short-neck flask, 50.00 g (0.208 mol) of 3-chloropropyltriethoxysilane, 22.26 g (0.218 mol) of sodium methanesulfinate, 6.22 g (0.042 mol) of sodium iodide, and 200.00 g of N-methylpyrrolidone were introduced, and heated to 150° C. to effect the reaction for 7 hours. The resultant reaction solution was subjected to liquid separation using toluene and water, and then, toluene was removed by an evaporator to obtain a crude product. The crude product was subjected to distillation under reduced pressure to obtain a target, Compound 2 (methanesulfonylpropyltriethoxysilane).

$^1$H-NMR (500 MHz, DMSO-d$_6$): 0.70 ppm (m, 2H), 1.16 ppm (t, 9H), 1.74 ppm (m, 2H), 2.93 ppm (s, 3H), 3.11 ppm (m, 2H), 3.76 ppm (m, 6H)

Synthesis of Compound 3/trifluoromethanesulfonamidepropyltriethoxysilane

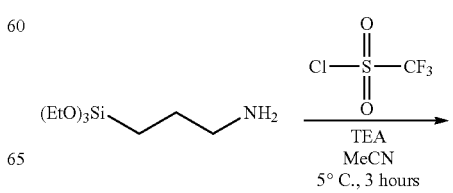

-continued

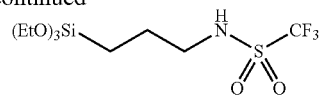

Into a 200-ml four-neck flask, 15.00 g (0.068 mol) of 3-aminopropyltriethoxysilane, 7.20 g (0.071 mol) of triethylamine (TEA), and 60 g of acetonitrile (MeCN) were introduced, and stirred at 5° C. 11.42 g (0.068 mol) of trifluoromethanesulfonyl chloride was added dropwise to the resultant reaction mixture, and then heated to 25° C. and stirred for 3 hours. The resultant salt was filtered off, followed by distillation under reduced pressure to obtain a target, trifluoromethanesulfonamidepropyltriethoxysilane.

$^1$H-NMR (500 MHz, DMSO-$d_6$): 0.58 ppm (t, 2H), 1.15 ppm (t, 9H), 1.53 ppm (m, 2H), 3.11 ppm (d, 2H), 3.75 (q, 6H), 9.32 (s, 1H)

Synthesis Example 1

24.82 g (70 mol %) of tetraethoxysilane, 1.69 g (5 mol %) of phenyltrimethoxysilane, 6.07 g (20 mol %) of methyltriethoxysilane, 2.89 g (5 mol %) of trifluoromethanesulfonylpropyltriethoxysilane, and 53.19 g of acetone were introduced into a 300-ml flask, and, while the resultant mixed solution was stirred with a magnetic stirrer, 11.35 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-1) and had a weight average molecular weight of Mw 1,800 by GPC in terms of polystyrene.

Synthesis Example 2

25.91 g (70 mol %) of tetraethoxysilane, 6.34 g (20 mol %) of methyltriethoxysilane, 3.00 g (5 mol %) of trifluoromethanesulfonylpropyltriethoxysilane, 2.15 g (5 mol %) of 4-methoxybenzyltrimethoxysilane, and 52.89 g of acetone were introduced into a 300-ml flask, and, while the resultant mixed solution was stirred with a magnetic stirrer, 11.85 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-2) and had a weight average molecular weight of Mw 1,600 by GPC in terms of polystyrene.

Synthesis Example 3

24.32 g (70 mol %) of tetraethoxysilane, 1.65 g (5 mol %) of phenyltrimethoxysilane, 3.87 g (13 mol %) of methyltriethoxysilane, 2.82 g (5 mol %) of trifluoromethanesulfonylpropyltriethoxysilane, 0.81 g (2 mol %) of 4-methoxybenzyltrimethoxysilane, 2.89 g (5 mol %) of phenylslufonylpropyltriethoxysilane, and 53.33 g of acetone were introduced into a 300-ml flask, and, while the resultant mixed solution was stirred with a magnetic stirrer, 11.12 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-3) and had a weight average molecular weight of Mw 1,800 by GPC in terms of polystyrene.

Synthesis Example 4

23.42 g (70 mol %) of tetraethoxysilane, 1.59 g (5 mol %) of phenyltrimethoxysilane, 2.29 g (8 mol %) of methyltriethoxysilane, 2.71 g (5 mol %) of trifluoromethanesulfonylpropyltriethoxysilane, 0.77 g (2 mol %) of 4-methoxybenzyltrimethoxysilane, 2.78 g (5 mol %) of phenylslufonylpropyltriethoxysilane, 2.91 g (5 mol %) of 2,2,2,5-trimethyl-5-(3-(triethoxysilyl)propyl)-1,3-dioxane-4,6-dione, and 53.57 g of acetone were introduced into a 300-ml flask, and, while the resultant mixed solution was stirred with a magnetic stirrer, 10.71 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-4) and had a weight average molecular weight of Mw 1,700 by GPC in terms of polystyrene.

Synthesis Example 5

23.11 g (70 mol %) of tetraethoxysilane, 1.57 g (5 mol %) of phenyltrimethoxysilane, 2.79 g (8 mol %) of acetoxymethyltriethoxysilane, 2.68 g (5 mol %) of trifluoromethanesulfonylpropyltriethoxysilane, 0.77 g (2 mol %) of 4-methoxybenzyltrimethoxysilane, 2.75 g (5 mol %) of phenylslufonylpropyltriethoxysilane, 2.87 g (5 mol %) of 2,2,2,5-trimethyl-5-(3-(triethoxysilyl)propyl)-1,3-dioxane-4,6-dione, and 53.66 g of acetone were introduced into a 300-ml flask, and, while the resultant mixed solution was stirred with a magnetic stirrer, 10.57 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monomethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-5) and had a weight average molecular weight of Mw 2,100 by GPC in terms of polystyrene.

Synthesis Example 6

23.74 g (70 mol %) of tetraethoxysilane, 3.37 g (5 mol %) of triethoxysilylpropyldiallyl isocyanurate, 5.80 g (20 mol %) of methyltriethoxysilane, 2.75 g (5 mol %) of trifluoromethanesulfonylpropyltriethoxysilane, and 53.66 g of acetone were introduced into a 300-ml flask, and, while the resultant mixed solution was stirred with a magnetic stirrer, 10.85 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol, ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-6) and had a weight average molecular weight of Mw 1,800 by GPC in terms of polystyrene.

Synthesis Example 7

24.63 g (70 mol %) of tetraethoxysilane, 1.67 g (5 mol %) of phenyltrimethoxysilane, 5.72 g (19 mol %) of methyltriethoxysilane, 2.86 g (5 mol %) of trifluoromethanesulfonylpropyltriethoxysilane, 0.61 g (0.1 mol %) of benzenesulfonamidepropyltriethoxysilane, and 53.24 g of acetone were introduced into a 300-ml flask, and, while the resultant mixed solution was stirred with a magnetic stirrer, 11.26 g of 0.01 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monomethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-7) and had a weight average molecular weight of Mw 1,800 by GPC in terms of polystyrene.

Synthesis Example 8

24.55 g (70 mol %) of tetraethoxysilane, 7.60 g (20 mol %) of methyltriethoxysilane, 3.01 g (5 mol %) of triethoxysilylpropyltrifluoromethanesulfonamide, and 53.18 g of acetone were introduced into a 300-ml flask, and, while the resultant mixed solution was stirred with a magnetic stirrer, 11.36 g of 1 mol/l hydrochloric acid was added dropwise to the mixed solution. After the completion of the addition, the flask was transferred into an oil bath adjusted to 85° C., and while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was concentrated to obtain a hydrolysis-condensation product (polymer) propylene glycol monomethyl ether acetate solution. To the obtained solution, propylene glycol monomethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-8) and had a weight average molecular weight of Mw 1,800 by GPC in terms of polystyrene.

Comparative Synthesis Example 1

25.81 g (70% by mole) of tetraethoxysilane, 9.47 g (30% by mole) of methyltriethoxysilane, and 52.92 g of acetone were introduced into a 300-ml flask, and, while the resultant mixed solution was stirred with a magnetic stirrer, 11.80 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (4-1) and had a weight average molecular weight of Mw 1,700 by GPC in terms of polystyrene.

Formula (4-1)

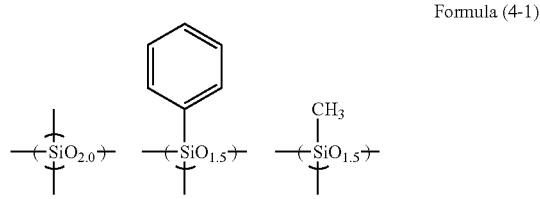

Comparative Synthesis Example 2

25.21 g (70% by mole) of tetraethoxysilane, 7.71 g (25% by mole) of methyltriethoxysilane, 2.45 g of methanesulfonylpropyltriethoxysilane, and 53.08 g of acetone were introduced into a 300-ml flask, and, while the resultant mixed solution was stirred with a magnetic stirrer, 11.53 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (4-2) and had a weight average molecular weight of Mw 1,800 by GPC in terms of polystyrene.

Formula (4-2)

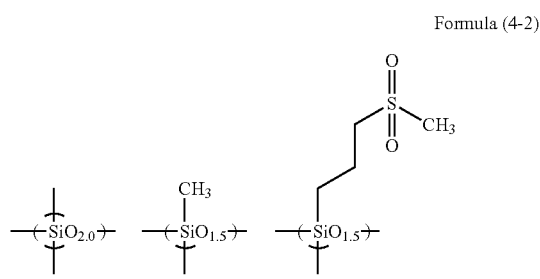

Comparative Synthesis Example 3

23.22 g (70% by mole) of tetraethoxysilane, 5.68 g (20% by mole) of methyltriethoxysilane, 6.85 g of trifluoromethylsulfonylphenoxypropyltriethoxysilane, and 53.63 g of acetone were introduced into a 300-ml flask, and, while the resultant mixed solution was stirred with a magnetic stirrer, 10.62 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (4-3) and had a weight average molecular weight of Mw 1,800 by GPC in terms of polystyrene.

Formula (4-3)

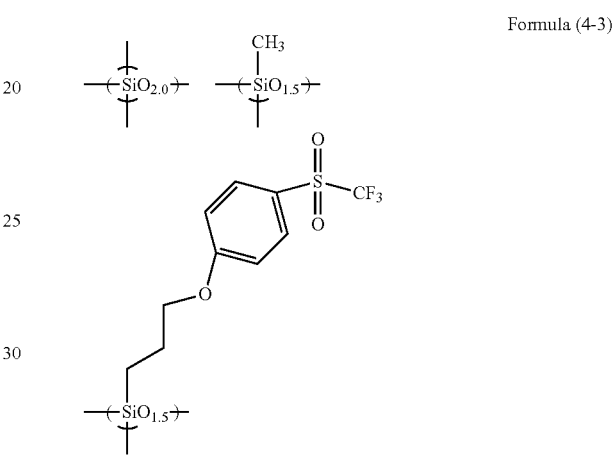

Preparation of Si-Containing Resist Underlayer Film-Forming Composition

Each of the silicon-containing polymers obtained in Synthesis Examples 1 to 8 and Comparative Synthesis Examples 1 to 3 was mixed with an acid, a curing catalyst, an additive, a solvent, and water in ratios shown in Table 1. The mixture was filtered with a 0.1-μm fluororesin filter to prepare a solution of the resist underlayer film-forming composition. The blending ratios of the polymers in Table 1 indicate not the blending amounts of the polymer solutions, but the blending amounts of the polymers themselves.

In Table 1, maleic acid is abbreviated as MA; benzyltriethylammonium chloride is abbreviated as BTEAC; N-(3-triethoxysilylpropyl)-4,5-dihydroimidazole is abbreviated as IMIDTEOS; triphenylsulfonium nitrate is abbreviated as TPSNO3; monotriphenylsulfonium maleate is abbreviated as TPSMA; triphenylsulfonium trifluoroacetate is abbreviated as TPSTFA; triphenylsulfonium chloride is abbreviated as TPSCl; triphenylsulfonium camphorsulfonate is abbreviated as TPSCS; triphenylsulfonium trifluoromethanesulfonate is abbreviated as TPSTf; triphenylsulfonium nonafluorobutanesulfonate is abbreviated as TPSNf; triphenylsulfonium adamantanecarboxy-1,1,2-trifluorobutanesulfonate is abbreviated as TPSAdTF; dihydroxyphenylphenylsulfonium p-toluenesulfonate is DHTPPSpTS; bisphenylsulfone is abbreviated as BPS; propylene glycol monomethyl ether acetate is abbreviated as PGMEA; propylene glycol monoethyl ether is abbreviated as PGEE; and propylene glycol monomethyl ether is abbreviated as PGME. As the water, ultrapure water was used. Each blending amount is expressed in part by mass.

TABLE 1

| | Si polymer | Acid | Curing catalyst | Additive | Solvent | | | |
|---|---|---|---|---|---|---|---|---|
| Example 1 | Synthesis Example 1 | MA | TPSMA | TPSCS | PGME | PGEE | PGMEA | Water |
| (part by mass) | 2 | 0.02 | 0.06 | 0.1 | 15 | 65 | 5 | 15 |
| Example 2 | Synthesis Example 2 | MA | TPSNO3 | TPSTf | PGME | PGEE | PGMEA | Water |
| (part by mass) | 2 | 0.02 | 0.006 | 0.006 | 15 | 65 | 5 | 15 |
| Example 3 | Synthesis Example 3 | MA | BTEAC | TPSNf | PGME | PGEE | PGMEA | Water |
| (part by mass) | 2 | 0.02 | 0.006 | 0.006 | 15 | 65 | 5 | 15 |
| Example 4 | Synthesis Example 4 | MA | IMIDTEOS | | PGME | PGEE | PGMEA | Water |
| (part by mass) | 2 | 0.02 | 0.006 | | 15 | 65 | 5 | 15 |
| Example 5 | Synthesis Example 5 | MA | IMIDTEOS | DHTPPSpTS | PGME | PGEE | PGMEA | Water |
| (part by mass) | 2 | 0.02 | 0.006 | 0.006 | 15 | 65 | 5 | 15 |
| Example 6 | Synthesis Example 6 | MA | TPSTFA | TPSAdTF | PGME | PGEE | PGMEA | Water |
| (part by mass) | 2 | 0.02 | 0.06 | 0.1 | 15 | 65 | 5 | 15 |
| Example 7 | Synthesis Example 7 | MA | TPSC1 | BPS | PGME | PGEE | PGMEA | Water |
| (part by mass) | 2 | 0.02 | 0.006 | 0.1 | 15 | 65 | 5 | 15 |
| Example 8 | Synthesis Example 8 | MA | TPSNO3 | TPSAdTF | PGME | PGEE | PGMEA | Water |
| (part by mass) | 2 | 0.02 | 0.006 | 0.1 | 15 | 65 | 5 | 15 |
| Comparative Example 1 | Comparative Synthesis Example 1 | MA | TPSMA | TPSCS | PGME | PGEE | PGMEA | Water |
| (part by mass) | 2 | 0.02 | 0.06 | 0.1 | 15 | 65 | 5 | 15 |
| Comparative Example 2 | Comparative Synthesis Example 2 | MA | TPSN03 | TPSCS | PGME | PGEE | PGMEA | Water |
| (part by mass) | 2 | 0.02 | 0.06 | 0.1 | 15 | 65 | 5 | 15 |
| Comparative Example 3 | Comparative Synthesis Example 3 | MA | TPSN03 | TPSCS | PGME | PGEE | PGMEA | Water |
| (part by mass) | 2 | 0.02 | 0.06 | 0.1 | 15 | 65 | 5 | 15 |

Preparation of Organic Resist Underlayer Film-Forming Composition

Under an atmosphere of nitrogen, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were introduced into a 100-ml four-neck flask, and 1,4-dioxane (6.69 g, manufactured by KANTO CHEMICAL CO., INC.) was charged therein and stirred. The resultant mixture was dissolved with the temperature increased to 100° C. to initiate polymerization. After 24 hours, the product was left cool to 60° C., and then, chloroform (34 g, manufactured by KANTO CHEMICAL CO., INC.) was added to dilute the product, and the resultant product was reprecipitated in methanol (168 g, manufactured by KANTO CHEMICAL CO., INC.). The obtained precipitate was filtered and dried with a vacuum drier at 80° C. for 24 hours, to obtain 9.37 g of a polymer (Formula (5-1), hereinafter abbreviated as PCzFL) as a target product.

Formula (5-1)

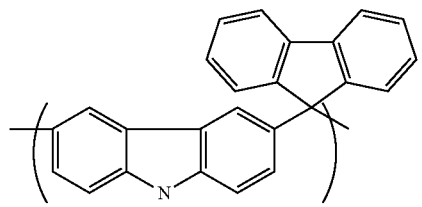

The measurement results of $^1$H-NMR of PCzFL were as follows.

$^1$H-NMR (400 MHz, DMSO-$d_6$): 67.03-7.55 (br, 12H), 67.61-8.10 (br, 4H), δ 11.18 (br, 1H)

The weight average molecular weight Mw of PCzFL measured by GPC in terms of polystyrene was 2,800, and the degree of poly-distribution Mw/Mn was 1.77.

20 g of the obtained resin was mixed with 3.0 g of tetramethoxymethyl glycoluril (the trade name Powderlink 1174, manufactured by Mitsui Cytec Ltd.) as a crosslinking agent, 0.30 g of pyridinium p-toluenesulfonate as a catalyst, and 0.06 g of MEGAFAC R-30 (the trade name, manufactured by DIC Corporation) as a surfactant. The mixture was dissolved in 88 g of propylene glycol monomethyl ether acetate to form a solution. The solution was then filtered with a polyethylene microfilter having a pore size of 0.10 μm, and further filtered with a polyethylene microfilter having a pore size of 0.05 μm to prepare a solution of an organic resist underlayer film (Layer A) forming composition used for a lithography process using a multilayer film.

(Optical Constant Measurement)

Each of the Si-containing resist underlayer film-forming compositions prepared in Examples 1 to 8 and Comparative Examples 1 to 3 was applied onto a silicon wafer by a spinner. The applied compositions each were heated on a hot plate at 200° C. for 1 minute to form the respective Si-containing resist underlayer films (with a film thickness of 0.05 μm). Then, the refractive indexes (n value) and the optical absorption coefficients (also referred to as k value or attenuation coefficient) at wavelengths of 193 nm of these resist underlayer films were measured using a spectroscopic ellipsometer (VUV-VASEVU-302, manufactured by J.A. Woollam Co.).

(Measurement of Dry Etching Rate)

For the measurement of dry etching rate, the following etcher and etching gas were used.

ES401 (manufactured by NIPPON SCIENTIFIC Co., Ltd.): $CF_4$

RIE-10NR (manufactured by SAMCO INC.): $O_2$

Each solution of the Si-containing resist underlayer film-forming compositions prepared in Examples 1 to 8 and Comparative Examples 1 to 3 was applied onto a silicon wafer using a spinner. The applied solutions were heated on a hot plate at 240° C. for 1 minute to form Si-containing resist underlayer films (having a film thickness of 0.08 μm (for the measurement of the etching rate using $CF_4$ gas) having a film thickness of 0.05 μm (for the measurement of the etching rate using $O_2$ gas)). Furthermore, in the same manner, an organic underlayer film-forming composition was applied onto a silicon wafer using a spinner to form a coating film (having a film thickness of 0.20 μm). Using $CF_4$ gas or $O_2$ gas as an etching gas, the dry etching rate of the organic underlayer films was measured, and compared with the dry etching rates of the Si-containing resist underlayer films of Examples 1 to 8 and Comparative Examples 1 to 3. The dry etching rate using the fluorine-based gas was expressed in (nm/min). Furthermore, the ratio of the etching rates using the oxygen-based gas was calculated using (dry etching rate of Si-containing resist underlayer film)/(dry etching rate of organic underlayer film).

(Evaluation of Resist Patterning: Evaluation Through NTD Process of Performing Development Using Organic Solvent)

The organic underlayer film (Layer A)-forming composition containing the structure of Formula (5-1) above was applied onto a silicon wafer, and the applied organic underlayer film was baked on a hot plate at 240° C. for 60 seconds to obtain an organic underlayer film (Layer A) having a film thickness of 200 nm. Each of the Si-containing resist underlayer film (Layer B)-forming compositions obtained in Examples 1 to 8 and Comparative Examples 1 to 3 was applied onto Layer A, followed by baking on a hot plate at 240° C. for 60 seconds to obtain a Si-containing resist underlayer film (Layer B). The Si-containing resist underlayer films (Layers B) had a film thickness of 30 nm.

Onto each of Layers B, a commercially available photoresist solution (trade name: FAiRS-9521NT05, manufactured by FUJIFILM Corporation) was applied by a spinner, and heated on a hot plate at 100° C. for 1 minute to form a photoresist film (Layer C) having a film thickness of 85 nm. Using a scanner, NSR-S307E, manufactured by Nikon Corporation (wavelength: 193 nm, NA, σ: 0.85, 0.93/0.85), each of the photoresist films was exposed through a mask that allows the formation of a 0.060-μm line and space (L/S)=1/2 dense line, in which the line width and the width between the lines of the photoresist were each 0.060 μm after development, or through a mask that allows the formation of a 0.058-m line and space (L/S)=1/1 dense line, in which the line width and the width between the lines of a photoresist were each 0.058 μm after development. Then, the photoresist film was baked on a hot plate at 100° C. for 60 seconds, and cooled down, then developed using butyl acetate (a solvent developer) for 60 seconds to form a negative-type pattern on the resist underlayer film (Layer B). In the obtained photoresist pattern, if any large pattern peeling, undercut, and line having a wider bottom (footing) were not observed, the pattern was evaluated as Good.

Table 2 shows refractive indexes at 193 nm, optical absorption coefficients, fluorine gas etching rates, oxygen-based gas resistance, and the lithography evaluation results of the skirt shapes of resists.

TABLE 2

| | Refractive index | Optical absorption coefficient | Fluorine-based gas etching rate (nm/min) | Oxygen-based gas resistance vs. organic underlayer film | Skirt shape of resist |
|---|---|---|---|---|---|
| Example 1 | 1.65 | 0.14 | 24 | 0.02 | Good |
| Example 2 | 1.60 | 0.25 | 25 | 0.03 | Good |
| Example 3 | 1.70 | 0.35 | 26 | 0.04 | Good |
| Example 4 | 1.68 | 0.33 | 27 | 0.04 | Good |
| Example 5 | 1.68 | 0.33 | 27 | 0.04 | Good |
| Example 6 | 1.64 | 0.14 | 30 | 0.03 | Good |
| Example 7 | 1.64 | 0.18 | 24 | 0.02 | Good |
| Example 8 | 1.56 | 0.08 | 23 | 0.02 | Good |
| Comparative Example 1 | 1.55 | 0.01 | 22 | 0.03 | Footing |
| Comparative Example 2 | 1.57 | 0.07 | 23 | 0.03 | Footing |
| Comparative Example 3 | 1.64 | 0.09 | 23 | 0.03 | Collapse |

[Resist Pattern Formation by EUV Exposure]

The organic underlayer film (Layer A)-forming composition was applied onto a silicon wafer, and the applied organic underlayer film was baked on a hot plate at 215° C. for 60 seconds to obtain an organic underlayer film (Layer A) having a film thickness of 90 nm. The organic underlayer film (Layer A) was spin-coated with each of the resist underlayer film-forming composition solutions prepared in Examples 1, and 6 to 8, and Comparative Examples 1 to 3, and was heated at 215° C. for 1 minute to form a resist underlayer film (Layer B) (20 nm). The resist underlayer as a hard mask was spin-coated with a resist solution for EUV (a methacrylate resin-based resist) and heated to form an EUV resist layer (Layer C). The EUV resist layer (Layer C) was exposed to light using an EUV exposure apparatus (Micro Exposure Tool, abbreviated as MET) under the conditions of NA=0.30, σ=0.36/0.93, Quadropole. After the light exposure, PEB was conducted, and then, the EUV resist layer was cooled to room temperature on a cooling plate, and developed, followed by a rinsing treatment to form a resist pattern. Formation of a line-and-space pattern of 26 nm was evaluated, and the shape of the pattern was evaluated by observing the section of the pattern.

In Table 3, Good means a state in which a shape between the footing shape and the undercut shape has no significant amount of residues in a space portion; Collapse means an unfavorable state in which a resist pattern has peeled off and collapsed; Bridge means an unfavorable state in which the top portions or bottom portions of a resist pattern are in contact with each other; and Poor resist coating properties means an unfavorable film forming state in which cissing is found after resist film forming.

TABLE 3

| | Pattern shape |
|---|---|
| Example 1 | Good |
| Example 6 | Good |
| Example 7 | Good |
| Example 8 | Good |
| Comparative Example 1 | Bridge |
| Comparative Example 2 | Bridge |
| Comparative Example 3 | Poor resist coating properties |

INDUSTRIAL APPLICABILITY

The resist underlayer film-forming composition of the present invention can be applied to, for example, resist underlayer film-forming compositions for ArF, KrF photoresists or the like; resist underlayer film-forming compositions for EUV resists or the like; upper layer film-forming compositions for EUV resists, resist underlayer film-forming compositions for electron beam resists or the like; upper layer film-forming compositions for electron beam resists; and reverse material-forming compositions.

The invention claimed is:

1. A resist underlayer film-forming composition for lithography, the composition comprising at least one silane, the at least one silane comprising:
    a hydrolyzable silane,
    a hydrolysis product thereof,
    a hydrolysis-condensation product thereof, or
    a combination of these,
in which the hydrolyzable silane comprises a hydrolyzable silane of Formula (1):

$$R^1_a R^2_b Si(R^3)_{4-(a+b)} \quad \text{Formula (1)}$$

where
    $R^1$ is an organic group of Formula (2):

$$-R^4-R^5-R^6 \quad \text{Formula (2)}$$

where
        $R^4$ is an optionally substituted $C_{1-10}$ alkylene group,
        $R^5$ is a sulfonyl group, and
        $R^6$ is a perfluoromethyl group, a perfluoroethyl group, a perfluoropropyl group, or a perfluorobutyl group,
    and is bonded to a silicon atom through a Si—C bond;
    $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;
    $R^3$ is an alkoxy group, an acyloxy group, or a halogen group;
    a is an integer of 1;
    b is an integer of 0 to 2; and
    a+b is an integer of 1 to 3; wherein in terms of the total moles of the at least one silane, the hydrolyzable silane of Formula (1) is present in an amount in the range of from 0.1% by mole to 10% by mole.

2. The resist underlayer film-forming composition according to claim 1, wherein in Formula (2), $R^6$ is a perfluorobutyl group.

3. The resist underlayer film-forming composition according to claim 1, wherein in Formula (2), $R^6$ is a trifluoromethyl group.

4. The resist underlayer film-forming composition according to claim 1, wherein the hydrolyzable silane is a combination of the hydrolyzable silane of Formula (1) and another hydrolyzable silane, the other hydrolyzable silane being at least one hydrolyzable silane selected from the group consisting of
    a hydrolyzable silane of Formula (3):

$$R^7_c Si(R^8)_{4-c} \quad \text{Formula (3)}$$

where
    $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond;

$R^8$ is an alkoxy group, an acyloxy group, or a halogen group; and
    c is an integer of 0 to 3; and
a hydrolyzable silane of Formula (4):

$$[R^9_d Si(R^{10})_{3-d}]_2 Y_e \quad \text{Formula (4)}$$

where
    $R^9$ is an alkyl group and is bonded to a silicon atom through a Si—C bond;
    $R^{10}$ is an alkoxy group, an acyloxy group, or a halogen group;
    Y is an alkylene group or an arylene group;
    d is an integer of 0 or 1; and
    e is an integer of 0 or 1.

5. The resist underlayer film-forming composition according to claim 1, further comprising an acid as a hydrolysis catalyst.

6. The resist underlayer film-forming composition according to claim 1, further comprising water.

7. A resist underlayer film obtained by applying the resist underlayer film-forming composition as claimed in claim 1 onto a semiconductor substrate, followed by baking.

8. A method for manufacturing a semiconductor device, the method comprising the steps of:
    applying the resist underlayer film-forming composition as claimed in claim 1 onto a semiconductor substrate, followed by baking to form a resist underlayer film;
    applying a resist composition onto the underlayer film to form a resist film;
    exposing the resist film to light;
    developing the resist film after the light exposure to obtain a resist pattern;
    etching the resist underlayer film with the resist pattern; and
    processing the semiconductor substrate with the patterned resist underlayer film.

9. A method for manufacturing a semiconductor device, the method comprising the steps of:
    forming an organic underlayer film on a semiconductor substrate;
    applying the resist underlayer film-forming composition as claimed in claim 1 onto the organic underlayer film, followed by baking to form a resist underlayer film;
    applying a resist composition onto the resist underlayer film to form a resist film;
    exposing the resist film to light;
    developing the resist film after the light exposure to obtain a resist pattern;
    etching the resist underlayer film with the resist pattern;
    etching the organic underlayer film with the patterned resist underlayer film; and
    processing the semiconductor substrate with the patterned organic underlayer film.

10. The resist underlayer film-forming composition according to claim 1, wherein
    b is an integer of 1 or 2; and
    $R^2$ is an aryl group, a halogenated aryl group, or an alkoxyaryl group, and the organic group is bonded to the silicon atom through a Si—C bond.

11. The resist underlayer film-forming composition according to claim 1, wherein
    b is an integer of 1 or 2; and
    $R^2$ is an organic group having an epoxy group, an acryloyl group, a methacryloyl group, a mercapto group, an amino group, or a cyano group, and the organic group is bonded to the silicon atom through a Si—C bond.

12. The resist underlayer film-forming composition according to claim 11, wherein the organic group selected from the group consisting of glycidoxymethyl, glycidoxyethyl, glycidoxypropyl, glycidoxybutyl, and epoxycyclohexyl.

13. The resist underlayer film-forming composition according to claim 11, wherein the organic group is selected from the group consisting of acryloylmethyl, acryloylethyl, and acryloylpropyl.

14. The resist underlayer film-forming composition according to claim 11, wherein the organic group is selected from the group consisting of methacryloylmethyl, methacryloylethyl, and methacryloylpropyl.

15. The resist underlayer film-forming composition according to claim 11, wherein the organic group is selected from the group consisting of ethylmercapto, butylmercapto, hexylmercapto, and octylmercapto.

16. The resist underlayer film-forming composition according to claim 11, wherein the organic group is selected from the group consisting of aminomethyl, aminoethyl, and aminopropyl.

17. The resist underlayer film-forming composition according to claim 11, wherein the organic group is selected from the group consisting of cyanoethyl and cyanopropyl.

18. A resist underlayer film-forming composition, comprising, as an underlayer film-forming polymer, a hydrolysis-condensation product of a hydrolyzable silane comprising a combination of 0.1% by mole to 10% by mole of a hydrolyzable silane of Formula (1):

$$R^1_a R^2_b Si(R^3)_{4-(a+b)} \quad \text{Formula (1)}$$

where $R^1$ is an organic group of Formula (2):

$$-R^4-R^5-R^6 \quad \text{Formula (2)}$$

where $R^4$ is an optionally substituted $C_{1-10}$ alkylene group, $R^5$ is a sulfonyl group, and $R^6$ is a perfluoromethyl group, a perfluoroethyl group, a perfluoropropyl group, or a perfluorobutyl group, and is bonded to a silicon atom through a Si—C bond;

$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

$R^3$ is an alkoxy group, an acyloxy group, or a halogen group;

a is an integer of 1;

b is an integer of 0 to 2; and a+b is an integer of 1 to 3; and a hydrolyzable silane of Formula (3):

$$R^7_c Si(R^8)_{4-c} \quad \text{Formula (3)}$$

where $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond;

$R^8$ is an alkoxy group, an acyloxy group, or a halogen group; and c is an integer of 0 to 3.

* * * * *